(12) United States Patent
Sainiemi et al.

(10) Patent No.: US 9,304,235 B2
(45) Date of Patent: Apr. 5, 2016

(54) MICROFABRICATION

(71) Applicant: MICROSOFT TECHNOLOGY LICENSING, LLC, Redmond, WA (US)

(72) Inventors: Lauri Sainiemi, Espoo (FI); Tapani Levola, Espoo (FI); Pasi Saarikko, Espoo (FI)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 14/447,464

(22) Filed: Jul. 30, 2014

(65) Prior Publication Data

US 2016/0033697 A1 Feb. 4, 2016

(51) Int. Cl.
| | |
|---|---|
| G02B 5/18 | (2006.01) |
| B05C 3/02 | (2006.01) |
| B05C 13/02 | (2006.01) |
| B05D 1/18 | (2006.01) |
| B05D 5/06 | (2006.01) |
| C03C 15/00 | (2006.01) |
| C03C 17/00 | (2006.01) |

(Continued)

(52) U.S. Cl.
CPC ............... *G02B 5/1857* (2013.01); *B05C 3/02* (2013.01); *B05C 13/02* (2013.01); *B05D 1/18* (2013.01); *B05D 5/06* (2013.01); *C03C 15/00* (2013.01); *C03C 17/00* (2013.01); *C03C 2218/111* (2013.01); *C03C 2218/33* (2013.01); *C23C 16/45525* (2013.01); *C23F 1/02* (2013.01)

(58) Field of Classification Search
None
See application file for complete search history.

(56) References Cited

U.S. PATENT DOCUMENTS

| | | | |
|---|---|---|---|
| 3,542,453 A | * | 11/1970 | Kantor ................ G02B 5/1857 216/24 |
| 3,836,258 A | | 9/1974 | Courten et al. |

(Continued)

FOREIGN PATENT DOCUMENTS

| | | |
|---|---|---|
| CN | 1440513 | 9/2003 |
| CN | 101029968 | 9/2007 |

(Continued)

OTHER PUBLICATIONS

"Advisory Action", U.S. Appl. No. 13/428,879, Sep. 19, 2014, 3 pages.

(Continued)

*Primary Examiner* — Anita Alanko
(74) *Attorney, Agent, or Firm* — Micah Goldsmith; Judy Yee; Micky Minhas

(57) ABSTRACT

Microfabrication processes and apparatuses for fabricating microstructures on a substrate are disclosed. The substrate has a current diffraction grating pattern formed by current surface modulations over at least a portion of the substrate's surface that exhibit a substantially uniform grating linewidth over the surface portion. An immersion depth of the substrate in a fluid for patterning the substrate is gradually changed so that different points on the surface portion are immersed for different immersion times. The fluid changes the linewidth of the surface modulations at each immersed point on the surface portion by an amount determined by the immersion time of that point, thereby changing the current diffraction grating pattern to a new diffraction grating pattern formed by new surface modulations over the surface portion that exhibit a spatially varying grating linewidth that varies over the surface portion.

20 Claims, 7 Drawing Sheets

(51) Int. Cl.
*C23F 1/02* (2006.01)
*C23C 16/455* (2006.01)

(56) References Cited

U.S. PATENT DOCUMENTS

| | | | |
|---|---|---|---|
| 3,906,528 A | 9/1975 | Johnson | |
| 3,971,065 A | 7/1976 | Bayer | |
| 4,294,507 A | 10/1981 | Johnson | |
| 4,711,512 A | 12/1987 | Upatnieks | |
| 4,758,087 A | 7/1988 | Hicks, Jr. | |
| 4,799,752 A | 1/1989 | Carome | |
| 4,822,145 A | 4/1989 | Staelin | |
| 4,860,361 A | 8/1989 | Sato et al. | |
| 4,957,351 A | 9/1990 | Shioji | |
| 5,004,673 A * | 4/1991 | Vlannes | G03F 7/001 216/24 |
| 5,019,808 A | 5/1991 | Prince et al. | |
| 5,019,898 A | 5/1991 | Chao et al. | |
| 5,106,181 A | 4/1992 | Rockwell, III | |
| 5,146,355 A | 9/1992 | Prince et al. | |
| 5,309,169 A | 5/1994 | Lippert | |
| 5,313,535 A | 5/1994 | Williams | |
| 5,359,444 A | 10/1994 | Piosenka et al. | |
| 5,413,884 A | 5/1995 | Koch et al. | |
| 5,455,458 A | 10/1995 | Quon et al. | |
| 5,459,611 A | 10/1995 | Bohn et al. | |
| 5,483,307 A | 1/1996 | Anderson | |
| 5,543,588 A | 8/1996 | Bisset et al. | |
| 5,549,212 A * | 8/1996 | Kanoh | G02F 1/133553 216/11 |
| 5,574,473 A | 11/1996 | Sekiguchi | |
| 5,579,830 A | 12/1996 | Giammaruti | |
| 5,583,609 A | 12/1996 | Mizutani et al. | |
| 5,606,455 A | 2/1997 | Eichenlaub | |
| 5,614,941 A | 3/1997 | Hines | |
| 5,648,643 A | 7/1997 | Knowles et al. | |
| 5,651,414 A | 7/1997 | Suzuki et al. | |
| 5,673,146 A | 9/1997 | Kelly | |
| 5,708,449 A | 1/1998 | Heacock et al. | |
| 5,714,967 A | 2/1998 | Okamura et al. | |
| 5,737,171 A | 4/1998 | Buller et al. | |
| 5,751,476 A | 5/1998 | Matsui et al. | |
| 5,771,042 A | 6/1998 | Santos-Gomez | |
| 5,771,320 A | 6/1998 | Stone | |
| 5,772,903 A * | 6/1998 | Hirsch | C03C 15/00 185/12 |
| 5,856,842 A | 1/1999 | Tedesco | |
| 5,861,931 A | 1/1999 | Gillian et al. | |
| 5,886,822 A | 3/1999 | Spitzer | |
| 5,940,149 A | 8/1999 | Vanderwerf | |
| 5,959,664 A | 9/1999 | Woodgate | |
| 5,982,553 A | 11/1999 | Bloom et al. | |
| 5,991,087 A | 11/1999 | Rallison | |
| 6,101,008 A | 8/2000 | Popovich | |
| 6,144,439 A | 11/2000 | Carollo | |
| 6,160,667 A | 12/2000 | Smoot | |
| 6,169,829 B1 * | 1/2001 | Laming | G02B 6/021 385/37 |
| 6,181,852 B1 * | 1/2001 | Adams | G02B 6/022 385/37 |
| 6,226,178 B1 | 5/2001 | Broder et al. | |
| 6,239,502 B1 | 5/2001 | Grewe et al. | |
| 6,271,808 B1 | 8/2001 | Corbin | |
| 6,307,142 B1 | 10/2001 | Allen et al. | |
| 6,323,949 B1 | 11/2001 | Lading et al. | |
| 6,323,970 B1 | 11/2001 | Popovich | |
| 6,377,401 B1 | 4/2002 | Bartlett | |
| 6,411,512 B1 | 6/2002 | Mankaruse et al. | |
| 6,417,892 B1 | 7/2002 | Sharp et al. | |
| 6,446,442 B1 | 9/2002 | Batchelor et al. | |
| 6,466,198 B1 | 10/2002 | Feinstein | |
| 6,470,289 B1 | 10/2002 | Peters et al. | |
| 6,481,851 B1 | 11/2002 | McNelley et al. | |
| 6,483,580 B1 | 11/2002 | Xu et al. | |
| 6,496,218 B2 | 12/2002 | Takigawa et al. | |
| 6,529,331 B2 | 3/2003 | Massof et al. | |
| 6,542,307 B2 | 4/2003 | Gleckman et al. | |
| 6,545,650 B1 | 4/2003 | Yamada et al. | |
| 6,553,165 B1 | 4/2003 | Temkin et al. | |
| 6,554,428 B2 | 4/2003 | Fergason et al. | |
| 6,577,411 B1 | 6/2003 | David | |
| 6,580,529 B1 | 6/2003 | Amitai et al. | |
| 6,606,152 B2 | 8/2003 | Littau | |
| 6,621,702 B2 | 9/2003 | Elias et al. | |
| 6,631,755 B1 | 10/2003 | Kung et al. | |
| 6,635,999 B2 | 10/2003 | Belliveau | |
| 6,639,201 B2 | 10/2003 | Almogy et al. | |
| 6,735,499 B2 | 5/2004 | Ohki et al. | |
| 6,753,828 B2 | 6/2004 | Tuceryan et al. | |
| 6,775,460 B2 | 8/2004 | Steiner et al. | |
| 6,792,328 B2 | 9/2004 | Laughery et al. | |
| 6,804,115 B2 | 10/2004 | Lai | |
| 6,809,925 B2 | 10/2004 | Belady et al. | |
| 6,825,987 B2 | 11/2004 | Repetto et al. | |
| 6,829,095 B2 | 12/2004 | Amitai | |
| 6,867,753 B2 | 3/2005 | Chinthammit et al. | |
| 6,888,613 B2 | 5/2005 | Robins et al. | |
| 6,889,755 B2 | 5/2005 | Zuo et al. | |
| 6,906,901 B1 | 6/2005 | Liu | |
| 6,916,584 B2 | 7/2005 | Sreenivasan et al. | |
| 6,919,867 B2 | 7/2005 | Sauer | |
| 6,947,020 B2 | 9/2005 | Kiser et al. | |
| 6,964,731 B1 | 11/2005 | Krisko et al. | |
| 6,971,443 B2 | 12/2005 | Kung et al. | |
| 6,992,738 B2 | 1/2006 | Ishihara et al. | |
| 6,997,241 B2 | 2/2006 | Chou et al. | |
| 7,006,215 B2 | 2/2006 | Hoff et al. | |
| 7,015,876 B1 | 3/2006 | Miller | |
| 7,031,894 B2 | 4/2006 | Niu et al. | |
| 7,048,385 B2 | 5/2006 | Beeson et al. | |
| 7,069,975 B1 | 7/2006 | Haws et al. | |
| 7,099,005 B1 | 8/2006 | Fabrikant et al. | |
| 7,113,605 B2 | 9/2006 | Rui et al. | |
| 7,116,555 B2 | 10/2006 | Kamath et al. | |
| 7,151,635 B2 | 12/2006 | Bidnyk et al. | |
| 7,184,615 B2 | 2/2007 | Levola | |
| 7,189,362 B2 | 3/2007 | Nordin et al. | |
| 7,191,820 B2 | 3/2007 | Chou et al. | |
| 7,193,584 B2 | 3/2007 | Lee et al. | |
| 7,196,758 B2 | 3/2007 | Crawford et al. | |
| 7,212,709 B2 | 5/2007 | Hosoi | |
| 7,212,723 B2 | 5/2007 | McLeod et al. | |
| 7,250,930 B2 | 7/2007 | Hoffman et al. | |
| 7,261,453 B2 | 8/2007 | Morejon et al. | |
| 7,261,827 B2 * | 8/2007 | Ootsu | C03C 25/68 216/11 |
| 7,271,795 B2 | 9/2007 | Bradski | |
| 7,277,282 B2 | 10/2007 | Tate | |
| 7,301,587 B2 | 11/2007 | Uehara et al. | |
| 7,333,690 B1 | 2/2008 | Peale et al. | |
| 7,337,018 B2 | 2/2008 | Espinoza-Ibarra et al. | |
| 7,359,420 B2 | 4/2008 | Shchegrov et al. | |
| 7,365,734 B2 | 4/2008 | Fateh et al. | |
| 7,369,101 B2 | 5/2008 | Sauer et al. | |
| 7,372,565 B1 | 5/2008 | Holden et al. | |
| 7,376,852 B2 | 5/2008 | Edwards | |
| 7,396,133 B2 | 7/2008 | Burnett et al. | |
| 7,412,306 B2 | 8/2008 | Katoh et al. | |
| 7,416,017 B2 | 8/2008 | Haws et al. | |
| 7,417,617 B2 | 8/2008 | Eichenlaub | |
| 7,428,001 B2 | 9/2008 | Schowengerdt et al. | |
| 7,430,349 B2 | 9/2008 | Jones | |
| 7,430,355 B2 | 9/2008 | Heikenfeld et al. | |
| 7,455,102 B2 | 11/2008 | Cheng | |
| 7,505,269 B1 | 3/2009 | Cosley et al. | |
| 7,513,627 B2 | 4/2009 | Larson et al. | |
| 7,515,143 B2 | 4/2009 | Keam et al. | |
| 7,532,227 B2 | 5/2009 | Nakajima et al. | |
| 7,542,665 B2 | 6/2009 | Lei | |
| 7,551,814 B1 | 6/2009 | Smits | |
| 7,576,916 B2 | 8/2009 | Amitai | |
| 7,583,327 B2 | 9/2009 | Takatani | |
| 7,607,111 B2 | 10/2009 | Vaananen et al. | |
| 7,612,882 B2 | 11/2009 | Wu et al. | |

(56) References Cited

U.S. PATENT DOCUMENTS

| | | |
|---|---|---|
| 7,619,895 B1 | 11/2009 | Wertz et al. |
| 7,631,687 B2 | 12/2009 | Yang |
| 7,646,606 B2 | 1/2010 | Rytka et al. |
| 7,649,594 B2 | 1/2010 | Kim et al. |
| 7,656,912 B2 | 2/2010 | Brueck et al. |
| 7,660,500 B2 | 2/2010 | Konttinen et al. |
| 7,679,641 B2 | 3/2010 | Lipton et al. |
| 7,693,292 B1 | 4/2010 | Gross et al. |
| 7,701,716 B2 | 4/2010 | Blanco, Jr. et al. |
| 7,716,003 B1 | 5/2010 | Wack et al. |
| 7,719,769 B2 | 5/2010 | Sugihara et al. |
| 7,728,933 B2 | 6/2010 | Kim et al. |
| 7,768,534 B2 | 8/2010 | Pentenrieder et al. |
| 7,777,944 B2 | 8/2010 | Ho et al. |
| 7,817,104 B2 | 10/2010 | Ryu et al. |
| 7,826,508 B2 * | 11/2010 | Reid .......... H01S 5/06256 372/102 |
| 7,832,885 B2 | 11/2010 | Hsiao et al. |
| 7,843,691 B2 | 11/2010 | Reichert et al. |
| 7,871,811 B2 | 1/2011 | Fang et al. |
| 7,894,613 B1 | 2/2011 | Ong et al. |
| 7,903,409 B2 | 3/2011 | Patel et al. |
| 7,909,958 B2 | 3/2011 | Washburn et al. |
| 7,941,231 B1 | 5/2011 | Dunn |
| 7,986,462 B2 | 7/2011 | Kobayashi et al. |
| 8,004,621 B2 | 8/2011 | Woodgate et al. |
| 8,014,644 B2 | 9/2011 | Morimoto et al. |
| 8,033,709 B2 | 10/2011 | Kao et al. |
| 8,046,616 B2 | 10/2011 | Edwards |
| 8,061,411 B2 | 11/2011 | Xu et al. |
| 8,085,948 B2 | 12/2011 | Thomas et al. |
| 8,092,064 B2 | 1/2012 | Erchak et al. |
| 8,125,579 B2 | 2/2012 | Khan et al. |
| 8,128,800 B2 | 3/2012 | Seo et al. |
| 8,160,411 B2 | 4/2012 | Levola et al. |
| 8,162,524 B2 | 4/2012 | Van Ostrand et al. |
| 8,195,220 B2 | 6/2012 | Kim et al. |
| 8,233,204 B1 | 7/2012 | Robbins et al. |
| 8,233,273 B2 | 7/2012 | Chen et al. |
| 8,246,170 B2 | 8/2012 | Yamamoto et al. |
| 8,274,614 B2 | 9/2012 | Yokote et al. |
| 8,358,400 B2 | 1/2013 | Escuti |
| 8,384,999 B1 | 2/2013 | Crosby et al. |
| 8,392,035 B2 | 3/2013 | Patel et al. |
| 8,395,898 B1 | 3/2013 | Chamseddine et al. |
| 8,418,083 B1 | 4/2013 | Lundy et al. |
| 8,446,340 B2 | 5/2013 | Aharoni |
| 8,472,119 B1 | 6/2013 | Kelly |
| 8,482,920 B2 | 7/2013 | Tissot et al. |
| 8,576,143 B1 | 11/2013 | Kelly |
| 8,611,014 B2 | 12/2013 | Valera et al. |
| 8,629,815 B2 | 1/2014 | Brin et al. |
| 8,638,498 B2 | 1/2014 | Bohn et al. |
| 8,645,871 B2 | 2/2014 | Fong et al. |
| 8,666,212 B1 | 3/2014 | Amirparviz |
| 8,712,598 B2 | 4/2014 | Dighde et al. |
| 8,754,831 B2 | 6/2014 | Kollin et al. |
| 8,810,600 B2 | 8/2014 | Bohn et al. |
| 8,817,350 B1 | 8/2014 | Robbins et al. |
| 8,823,531 B1 | 9/2014 | McCleary et al. |
| 8,909,384 B1 | 12/2014 | Beitelmal et al. |
| 8,917,453 B2 | 12/2014 | Bohn |
| 8,934,235 B2 | 1/2015 | Rubenstein et al. |
| 8,941,683 B2 | 1/2015 | Son et al. |
| 8,989,535 B2 | 3/2015 | Robbins |
| 2001/0043208 A1 | 11/2001 | Furness, III et al. |
| 2002/0035455 A1 | 3/2002 | Niu et al. |
| 2002/0038196 A1 | 3/2002 | Johnson et al. |
| 2002/0041735 A1 | 4/2002 | Cai et al. |
| 2002/0044152 A1 | 4/2002 | Abbott et al. |
| 2002/0044162 A1 | 4/2002 | Sawatari |
| 2002/0063820 A1 | 5/2002 | Broer et al. |
| 2002/0097558 A1 | 7/2002 | Stone et al. |
| 2002/0171939 A1 | 11/2002 | Song |
| 2002/0180659 A1 | 12/2002 | Takahashi |
| 2003/0006364 A1 | 1/2003 | Katzir et al. |
| 2003/0023889 A1 | 1/2003 | Hofstee et al. |
| 2003/0179453 A1 | 9/2003 | Mori et al. |
| 2004/0011503 A1 | 1/2004 | Kung et al. |
| 2004/0042724 A1 | 3/2004 | Gombert et al. |
| 2004/0085649 A1 | 5/2004 | Repetto et al. |
| 2004/0108971 A1 | 6/2004 | Waldern et al. |
| 2004/0109234 A1 | 6/2004 | Levola |
| 2004/0135209 A1 | 7/2004 | Hsieh et al. |
| 2004/0151466 A1 * | 8/2004 | Crossman-Bosworth G02B 6/25 385/140 |
| 2004/0267990 A1 | 12/2004 | Lin |
| 2005/0100272 A1 | 5/2005 | Gilman |
| 2005/0174737 A1 | 8/2005 | Meir |
| 2005/0207120 A1 | 9/2005 | Tseng et al. |
| 2005/0243107 A1 | 11/2005 | Haim et al. |
| 2005/0248705 A1 | 11/2005 | Smith et al. |
| 2005/0285878 A1 | 12/2005 | Singh et al. |
| 2006/0018025 A1 | 1/2006 | Sharon et al. |
| 2006/0032616 A1 | 2/2006 | Yang |
| 2006/0038881 A1 | 2/2006 | Starkweather et al. |
| 2006/0054787 A1 | 3/2006 | Olsen et al. |
| 2006/0072206 A1 | 4/2006 | Tsuyuki et al. |
| 2006/0118280 A1 | 6/2006 | Liu |
| 2006/0129951 A1 | 6/2006 | Vaananen et al. |
| 2006/0132806 A1 | 6/2006 | Shchegrov et al. |
| 2006/0132914 A1 | 6/2006 | Weiss et al. |
| 2006/0139447 A1 | 6/2006 | Unkrich |
| 2006/0152646 A1 | 7/2006 | Schrader |
| 2006/0164382 A1 | 7/2006 | Kulas et al. |
| 2006/0183331 A1 | 8/2006 | Hofmann |
| 2006/0196643 A1 | 9/2006 | Hata et al. |
| 2006/0221448 A1 | 10/2006 | Nivon et al. |
| 2006/0228073 A1 | 10/2006 | Mukawa et al. |
| 2006/0249765 A1 | 11/2006 | Hsieh |
| 2007/0002412 A1 | 1/2007 | Aihara |
| 2007/0008456 A1 | 1/2007 | Lesage et al. |
| 2007/0023703 A1 | 2/2007 | Sunaoshi et al. |
| 2007/0027591 A1 | 2/2007 | Goldenberg et al. |
| 2007/0041684 A1 | 2/2007 | Popovich et al. |
| 2007/0097019 A1 | 5/2007 | Wynne-Powell et al. |
| 2007/0147673 A1 | 6/2007 | Crandall |
| 2007/0153395 A1 | 7/2007 | Repetto et al. |
| 2007/0177260 A1 | 8/2007 | Kuppenheimer et al. |
| 2007/0214180 A1 | 9/2007 | Crawford |
| 2007/0236959 A1 | 10/2007 | Tolbert |
| 2007/0284093 A1 | 12/2007 | Bhatti et al. |
| 2008/0014534 A1 | 1/2008 | Barwicz et al. |
| 2008/0025350 A1 | 1/2008 | Arbore et al. |
| 2008/0043100 A1 | 2/2008 | Sobel et al. |
| 2008/0043425 A1 | 2/2008 | Hebert et al. |
| 2008/0088603 A1 | 4/2008 | Eliasson et al. |
| 2008/0088624 A1 | 4/2008 | Long et al. |
| 2008/0106677 A1 | 5/2008 | Kuan et al. |
| 2008/0117341 A1 | 5/2008 | McGrew |
| 2008/0141681 A1 | 6/2008 | Arnold |
| 2008/0150913 A1 | 6/2008 | Bell et al. |
| 2008/0174735 A1 | 7/2008 | Quach et al. |
| 2008/0232680 A1 | 9/2008 | Berestov et al. |
| 2008/0248852 A1 | 10/2008 | Rasmussen |
| 2008/0285140 A1 | 11/2008 | Amitai |
| 2008/0297535 A1 | 12/2008 | Reinig |
| 2008/0303918 A1 | 12/2008 | Keithley |
| 2008/0311386 A1 | 12/2008 | Wendt |
| 2009/0002939 A1 | 1/2009 | Baugh et al. |
| 2009/0015742 A1 | 1/2009 | Liao et al. |
| 2009/0021908 A1 | 1/2009 | Patel et al. |
| 2009/0051283 A1 | 2/2009 | Cok et al. |
| 2009/0084525 A1 | 4/2009 | Satou et al. |
| 2009/0092261 A1 | 4/2009 | Bard |
| 2009/0097127 A1 | 4/2009 | Amitai |
| 2009/0128449 A1 | 5/2009 | Brown et al. |
| 2009/0128901 A1 | 5/2009 | Tilleman et al. |
| 2009/0180250 A1 | 7/2009 | Holling et al. |
| 2009/0189974 A1 | 7/2009 | Deering |
| 2009/0190003 A1 | 7/2009 | Park et al. |
| 2009/0195756 A1 | 8/2009 | Li et al. |
| 2009/0199128 A1 | 8/2009 | Matthews et al. |

(56) References Cited

U.S. PATENT DOCUMENTS

| | | |
|---|---|---|
| 2009/0222147 A1 | 9/2009 | Nakashima et al. |
| 2009/0224416 A1* | 9/2009 | Laakkonen ............ B82Y 10/00 264/1.38 |
| 2009/0235203 A1 | 9/2009 | Iizuka |
| 2009/0244413 A1 | 10/2009 | Ishikawa et al. |
| 2009/0246707 A1 | 10/2009 | Li et al. |
| 2009/0256837 A1 | 10/2009 | Deb et al. |
| 2009/0262419 A1 | 10/2009 | Robinson et al. |
| 2010/0002989 A1 | 1/2010 | Tokushima |
| 2010/0021108 A1 | 1/2010 | Kang et al. |
| 2010/0053151 A1 | 3/2010 | Marti et al. |
| 2010/0060551 A1 | 3/2010 | Sugiyama et al. |
| 2010/0061078 A1 | 3/2010 | Kim |
| 2010/0074291 A1 | 3/2010 | Nakamura |
| 2010/0084674 A1 | 4/2010 | Paetzold et al. |
| 2010/0096617 A1 | 4/2010 | Shanks |
| 2010/0103078 A1 | 4/2010 | Mukawa et al. |
| 2010/0134534 A1 | 6/2010 | Seesselberg et al. |
| 2010/0141905 A1 | 6/2010 | Burke |
| 2010/0149073 A1 | 6/2010 | Chaum et al. |
| 2010/0188353 A1 | 7/2010 | Yoon et al. |
| 2010/0200736 A1 | 8/2010 | Laycock et al. |
| 2010/0201953 A1 | 8/2010 | Freeman et al. |
| 2010/0211575 A1 | 8/2010 | Collins et al. |
| 2010/0213467 A1 | 8/2010 | Lee et al. |
| 2010/0220439 A1 | 9/2010 | Qin |
| 2010/0229853 A1 | 9/2010 | Vandal et al. |
| 2010/0238270 A1 | 9/2010 | Bjelkhagen et al. |
| 2010/0245387 A1 | 9/2010 | Bachelder et al. |
| 2010/0259889 A1 | 10/2010 | Chen et al. |
| 2010/0271467 A1 | 10/2010 | Akeley |
| 2010/0277421 A1 | 11/2010 | Charlier et al. |
| 2010/0277439 A1 | 11/2010 | Charlier et al. |
| 2010/0277779 A1 | 11/2010 | Futterer et al. |
| 2010/0300654 A1 | 12/2010 | Edwards |
| 2010/0309687 A1 | 12/2010 | Sampsell et al. |
| 2010/0315781 A1 | 12/2010 | Agostini |
| 2010/0317132 A1 | 12/2010 | Rogers et al. |
| 2010/0321609 A1 | 12/2010 | Qi et al. |
| 2010/0328351 A1 | 12/2010 | Tan |
| 2011/0012814 A1 | 1/2011 | Tanaka |
| 2011/0021251 A1 | 1/2011 | Lindén |
| 2011/0025605 A1 | 2/2011 | Kwitek |
| 2011/0032482 A1 | 2/2011 | Agurok |
| 2011/0050547 A1 | 3/2011 | Mukawa |
| 2011/0050655 A1 | 3/2011 | Mukawa |
| 2011/0063795 A1 | 3/2011 | Yeh et al. |
| 2011/0075442 A1 | 3/2011 | Chiang |
| 2011/0084893 A1 | 4/2011 | Lee et al. |
| 2011/0090343 A1 | 4/2011 | Alt et al. |
| 2011/0091156 A1 | 4/2011 | Laughlin |
| 2011/0099512 A1 | 4/2011 | Jeong |
| 2011/0114823 A1 | 5/2011 | Katzir et al. |
| 2011/0127024 A1 | 6/2011 | Patel et al. |
| 2011/0134017 A1 | 6/2011 | Burke |
| 2011/0134645 A1 | 6/2011 | Hitchcock et al. |
| 2011/0141388 A1 | 6/2011 | Park et al. |
| 2011/0148931 A1 | 6/2011 | Kim |
| 2011/0163986 A1 | 7/2011 | Lee et al. |
| 2011/0175930 A1 | 7/2011 | Hwang et al. |
| 2011/0194029 A1 | 8/2011 | Herrmann et al. |
| 2011/0205251 A1 | 8/2011 | Auld |
| 2011/0210946 A1 | 9/2011 | Goertz et al. |
| 2011/0214082 A1 | 9/2011 | Osterhout et al. |
| 2011/0215349 A1 | 9/2011 | An et al. |
| 2011/0221658 A1 | 9/2011 | Haddick et al. |
| 2011/0221659 A1 | 9/2011 | King et al. |
| 2011/0222236 A1 | 9/2011 | Luo et al. |
| 2011/0227820 A1 | 9/2011 | Haddick et al. |
| 2011/0227913 A1 | 9/2011 | Hyndman |
| 2011/0235179 A1 | 9/2011 | Simmonds |
| 2011/0242145 A1 | 10/2011 | Nishimura et al. |
| 2011/0242392 A1 | 10/2011 | Chiang |
| 2011/0242757 A1 | 10/2011 | Tracy et al. |
| 2011/0248904 A1 | 10/2011 | Miyawaki et al. |
| 2011/0248958 A1 | 10/2011 | Gruhlke et al. |
| 2011/0267799 A1 | 11/2011 | Epstein et al. |
| 2011/0283223 A1 | 11/2011 | Vaittinen et al. |
| 2011/0299044 A1 | 12/2011 | Yeh et al. |
| 2011/0304640 A1 | 12/2011 | Noge |
| 2011/0309378 A1 | 12/2011 | Lau et al. |
| 2011/0310232 A1 | 12/2011 | Wilson et al. |
| 2011/0310312 A1 | 12/2011 | Yokote et al. |
| 2012/0013651 A1 | 1/2012 | Trayner et al. |
| 2012/0019434 A1 | 1/2012 | Kuhlman et al. |
| 2012/0026161 A1 | 2/2012 | Chen et al. |
| 2012/0033306 A1 | 2/2012 | Valera et al. |
| 2012/0038629 A1 | 2/2012 | Brown et al. |
| 2012/0041721 A1 | 2/2012 | Chen |
| 2012/0050144 A1 | 3/2012 | Morlock et al. |
| 2012/0052934 A1 | 3/2012 | Maharbiz et al. |
| 2012/0062998 A1 | 3/2012 | Schultz et al. |
| 2012/0069413 A1 | 3/2012 | Schultz |
| 2012/0106170 A1 | 5/2012 | Matthews et al. |
| 2012/0111544 A1 | 5/2012 | Senatori |
| 2012/0113092 A1 | 5/2012 | Bar-Zeev et al. |
| 2012/0120493 A1 | 5/2012 | Simmonds et al. |
| 2012/0134623 A1 | 5/2012 | Boudreau et al. |
| 2012/0144331 A1 | 6/2012 | Tolonen et al. |
| 2012/0157114 A1 | 6/2012 | Alameh et al. |
| 2012/0162764 A1 | 6/2012 | Shimizu |
| 2012/0176474 A1 | 7/2012 | Border |
| 2012/0182687 A1 | 7/2012 | Dighde et al. |
| 2012/0188205 A1 | 7/2012 | Jansson et al. |
| 2012/0195553 A1 | 8/2012 | Hasegawa et al. |
| 2012/0200495 A1 | 8/2012 | Johansson |
| 2012/0206589 A1 | 8/2012 | Crandall |
| 2012/0206880 A1 | 8/2012 | Andres et al. |
| 2012/0218301 A1 | 8/2012 | Miller |
| 2012/0227006 A1 | 9/2012 | Amm |
| 2012/0235885 A1 | 9/2012 | Miller et al. |
| 2012/0242561 A1 | 9/2012 | Sugihara |
| 2012/0256856 A1 | 10/2012 | Suzuki et al. |
| 2012/0256963 A1 | 10/2012 | Suzuki et al. |
| 2012/0262657 A1 | 10/2012 | Nakanishi et al. |
| 2012/0287381 A1 | 11/2012 | Li et al. |
| 2012/0292535 A1 | 11/2012 | Choi et al. |
| 2013/0000871 A1 | 1/2013 | Olson et al. |
| 2013/0033485 A1 | 2/2013 | Kollin et al. |
| 2013/0081779 A1 | 4/2013 | Liao et al. |
| 2013/0093741 A1 | 4/2013 | Akimoto et al. |
| 2013/0106674 A1 | 5/2013 | Wheeler et al. |
| 2013/0162673 A1 | 6/2013 | Bohn |
| 2013/0163089 A1 | 6/2013 | Bohn |
| 2013/0170031 A1 | 7/2013 | Bohn |
| 2013/0170802 A1 | 7/2013 | Pitwon |
| 2013/0186596 A1 | 7/2013 | Rubenstein |
| 2013/0186598 A1 | 7/2013 | Rubenstein |
| 2013/0187943 A1 | 7/2013 | Bohn et al. |
| 2013/0198176 A1 | 8/2013 | Kim |
| 2013/0207964 A1 | 8/2013 | Fleck |
| 2013/0208003 A1 | 8/2013 | Bohn |
| 2013/0208362 A1 | 8/2013 | Bohn |
| 2013/0208482 A1 | 8/2013 | Fleck |
| 2013/0215081 A1 | 8/2013 | Levin et al. |
| 2013/0226931 A1 | 8/2013 | Hazel et al. |
| 2013/0242056 A1 | 9/2013 | Fleck |
| 2013/0252628 A1 | 9/2013 | Kuehnel |
| 2013/0257848 A1 | 10/2013 | Westerinen et al. |
| 2013/0258701 A1 | 10/2013 | Westerinen et al. |
| 2013/0267309 A1 | 10/2013 | Robbins |
| 2013/0294030 A1 | 11/2013 | Wang et al. |
| 2013/0307875 A1 | 11/2013 | Anderson |
| 2013/0314793 A1 | 11/2013 | Robbins |
| 2013/0322810 A1 | 12/2013 | Robbins |
| 2013/0332159 A1 | 12/2013 | Federighi et al. |
| 2013/0335671 A1 | 12/2013 | Fleck |
| 2013/0339446 A1 | 12/2013 | Balassanian et al. |
| 2013/0342674 A1 | 12/2013 | Dixon |
| 2013/0346725 A1 | 12/2013 | Lomet et al. |
| 2014/0010265 A1 | 1/2014 | Peng |
| 2014/0041827 A1 | 2/2014 | Giaimo |
| 2014/0063367 A1 | 3/2014 | Yang et al. |
| 2014/0078130 A1 | 3/2014 | Uchino et al. |

(56) References Cited

U.S. PATENT DOCUMENTS

| | | | |
|---|---|---|---|
| 2014/0094973 A1 | 4/2014 | Giaimo et al. | |
| 2014/0104665 A1 | 4/2014 | Popovich et al. | |
| 2014/0104685 A1 | 4/2014 | Bohn | |
| 2014/0111865 A1 | 4/2014 | Kobayashi | |
| 2014/0116982 A1 | 5/2014 | Schellenberg et al. | |
| 2014/0140653 A1 | 5/2014 | Brown et al. | |
| 2014/0140654 A1 | 5/2014 | Brown et al. | |
| 2014/0143351 A1 | 5/2014 | Deng | |
| 2014/0176528 A1 | 6/2014 | Robbins | |
| 2014/0184699 A1 | 7/2014 | Ito et al. | |
| 2014/0204455 A1 | 7/2014 | Popovich | |
| 2014/0240842 A1 | 8/2014 | Nguyen et al. | |
| 2014/0314374 A1* | 10/2014 | Fattal | G02B 6/124 385/33 |
| 2015/0168731 A1 | 6/2015 | Robbins | |

FOREIGN PATENT DOCUMENTS

| | | |
|---|---|---|
| CN | 101105512 | 1/2008 |
| CN | 102004315 | 4/2011 |
| EP | 0977022 | 2/2000 |
| EP | 1494109 | 1/2005 |
| EP | 1847924 A1 | 10/2007 |
| EP | 2083310 A2 | 7/2009 |
| EP | 2112547 | 10/2009 |
| EP | 2144177 A2 | 1/2010 |
| EP | 2216678 | 1/2010 |
| EP | 2662761 A1 | 11/2013 |
| EP | 2752691 A1 | 7/2014 |
| FR | 2942811 A1 | 9/2010 |
| JP | H0422358 | 1/1992 |
| JP | 7311303 | 11/1995 |
| JP | 2000347037 | 12/2000 |
| JP | 2001078234 | 3/2001 |
| JP | 2008017135 | 1/2008 |
| KR | 20070001771 A | 1/2007 |
| KR | 20090076539 | 7/2009 |
| KR | 20090084316 | 8/2009 |
| KR | 20110070087 | 6/2011 |
| KR | 20120023458 | 3/2012 |
| TW | 201407202 | 2/2014 |
| WO | WO-9418595 | 8/1994 |
| WO | WO-0133282 | 5/2001 |
| WO | WO-0195027 | 12/2001 |
| WO | WO-03090611 | 11/2003 |
| WO | WO-2006054056 | 5/2006 |
| WO | 2007057500 A1 | 5/2007 |
| WO | WO-2008021504 | 2/2008 |
| WO | WO-2009077601 | 6/2009 |
| WO | WO-2010125337 | 11/2010 |
| WO | WO-2011003381 | 1/2011 |
| WO | WO-2011051660 | 5/2011 |
| WO | WO-2011090455 | 7/2011 |
| WO | WO-2011110728 | 9/2011 |
| WO | WO-2011131978 | 10/2011 |
| WO | 2012177811 A1 | 12/2012 |
| WO | WO-2012172295 | 12/2012 |
| WO | WO-2013058769 | 4/2013 |
| WO | 2014088343 A1 | 6/2014 |
| WO | WO-2014130383 | 8/2014 |

OTHER PUBLICATIONS

"Augmented Reality and Physical Games", U.S. Appl. No. 13/440,165, Apr. 5, 2012, 49 pages.
"BragGrate Mirror", Retrieved from <http://web.archive.org/web/20090814104232/http://www.optigrate.com/BragGrate_Mirror.html> on Jul. 8, 2014, Aug. 14, 2009, 2 pages.
"Corrected Final Office Action", U.S. Appl. No. 13/432,311, Dec. 24, 2014, 25 pages.
"Corrected Notice of Allowance", U.S. Appl. No. 13/355,836, Sep. 11, 2014, 2 pages.
"Corrected Notice of Allowance", U.S. Appl. No. 13/355,836, Dec. 15, 2014, 2 pages.
"DigiLens", SBG Labs—retrieved from <http://www.digilens.com/products.html> on Jun. 19, 2012, 1 page.
"Final Office Action", U.S. Appl. No. 13/336,873, Jan. 5, 2015, 21 pages.
"Final Office Action", U.S. Appl. No. 13/336,895, May 27, 2014, 11 pages.
"Final Office Action", U.S. Appl. No. 13/355,836, Mar. 10, 2014, 18 pages.
"Final Office Action", U.S. Appl. No. 13/355,914, Feb. 23, 2015, 21 pages.
"Final Office Action", U.S. Appl. No. 13/355,914, Jun. 19, 2014, 11 pages.
"Final Office Action", U.S. Appl. No. 13/397,495, May 29, 2014, 10 pages.
"Final Office Action", U.S. Appl. No. 13/397,516, Jan. 29, 2015, 13 pages.
"Final Office Action", U.S. Appl. No. 13/397,539, Jun. 29, 2015, 11 pages.
"Final Office Action", U.S. Appl. No. 13/428,879, Jul. 14, 2014, 12 pages.
"Final Office Action", U.S. Appl. No. 13/432,311, Dec. 15, 2014, 24 pages.
"Final Office Action", U.S. Appl. No. 13/432,372, Jan. 29, 2015, 33 pages.
"Final Office Action", U.S. Appl. No. 13/440,165, Jun. 6, 2014, 12 pages.
"Final Office Action", U.S. Appl. No. 13/440,165, Jul. 21, 2015, 11 pages.
"Final Office Action", U.S. Appl. No. 13/477,646, Feb. 23, 2015, 36 pages.
"Final Office Action", U.S. Appl. No. 13/477,646, May 5, 2014, 26 pages.
"Final Office Action", U.S. Appl. No. 13/525,649, Oct. 9, 2014, 8 pages.
"Final Office Action", U.S. Appl. No. 13/774,875, Jun. 4, 2015, 10 pages.
"Final Office Action", U.S. Appl. No. 14/134,993, Jul. 16, 2015, 19 pages.
"Final Office Action", U.S. Appl. No. 14/134,993, Aug. 20, 2014, 15 pages.
"Foreign Notice of Allowance", CN Application No. 201320034345.X, Aug. 14, 2013, 2 Pages.
"Foreign Office Action", CN Application No. 201210563730.3, Jan. 7, 2015, 16 pages.
"Foreign Office Action", CN Application No. 201210567932.5, Aug. 14, 2014, 12 pages.
"Foreign Office Action", EP Application No. 13769961.7, Mar. 11, 2015, 8 pages.
"Foreign Office Action", EP Application No. 13769961.7, Jun. 30, 2015, 6 pages.
"HDTV Helmet Mounted Display", Available at <http://defense-update.com/products/h/HDTV-HMD.htm>, Jan. 26, 2005, 1 page.
"International Search Report and Written Opinion", Application No. PCT/US2012/069331, Mar. 29, 2013, 10 pages.
"International Search Report and Written Opinion", Application No. PCT/US2014/016658, Apr. 23, 2014, 10 pages.
"International Search Report and Written Opinion", Application No. PCT/US2013/053676, Oct. 16, 2013, 10 pages.
"International Search Report and Written Opinion", Application No. PCT/US2013/030632, Jun. 26, 2013, 10 pages.
"International Search Report and Written Opinion", Application No. PCT/US2013/028477, Jun. 21, 2013, 11 pages.
"International Search Report and Written Opinion", Application No. PCT/US2013/031111, Jun. 26, 2013, 11 pages.
"International Search Report and Written Opinion", Application No. PCT/US2013/076832, Mar. 17, 2014, 12 pages.
"International Search Report and Written Opinion", Application No. PCT/US2013/061225, Jun. 4, 2014, 12 pages.
"International Search Report and Written Opinion", Application No. PCT/US2012/071563, Apr. 25, 2013, 13 pages.
"International Search Report and Written Opinion", Application No. PCT/US2013/021784, Apr. 30, 2013, 9 pages.

(56) References Cited

OTHER PUBLICATIONS

"International Search Report and Written Opinion", Application No. PCT/US2012/069330, Mar. 28, 2013, 9 pages.

"International Search Report and Written Opinion", Application No. PCT/US2013/021783, May 15, 2013, 9 pages.

"International Search Report and Written Opinion", Application No. PCT/US2013/026200, Jun. 3, 2013, 9 pages.

"Light Guide Techniques using LED Lamps", Application Brief I-003, retrieved from <http://www.ciri.org.nz/downloads/Lightpipe%20design.pdf> on Jan. 12, 2012, Oct. 14, 2008, 22 pages.

"New Technology from MIT may Enable Cheap, Color, Holographic Video Displays", Retrieved from <http://www.gizmag.com/holograph-3d-color-video-display-inexpensive-mit/28029/> on Feb. 25, 2015, Jun. 24, 2013, 8 pages.

"Non-Final Office Action", U.S. Appl. No. 13/397,495, Nov. 13, 2013, 8 pages.

"Non-Final Office Action", U.S. Appl. No. 13/440,165, Feb. 6, 2014, 12 pages.

"Non-Final Office Action", U.S. Appl. No. 13/336,873, Apr. 9, 2015, 18 pages.

"Non-Final Office Action", U.S. Appl. No. 13/336,873, Jul. 25, 2014, 16 pages.

"Non-Final Office Action", U.S. Appl. No. 13/336,895, Oct. 24, 2013, 9 pages.

"Non-Final Office Action", U.S. Appl. No. 13/343,675, Jul. 16, 2013, 9 pages.

"Non-Final Office Action", U.S. Appl. No. 13/355,836, Nov. 4, 2013, 15 pages.

"Non-Final Office Action", U.S. Appl. No. 13/355,914, Feb. 14, 2014, 10 pages.

"Non-Final Office Action", U.S. Appl. No. 13/355,914, Oct. 28, 2014, 18 pages.

"Non-Final Office Action", U.S. Appl. No. 13/397,495, Apr. 3, 2015, 11 pages.

"Non-Final Office Action", U.S. Appl. No. 13/397,516, Jun. 12, 2014, 11 pages.

"Non-Final Office Action", U.S. Appl. No. 13/397,516, Nov. 25, 2013, 10 pages.

"Non-Final Office Action", U.S. Appl. No. 13/397,539, Mar. 16, 2015, 9 pages.

"Non-Final Office Action", U.S. Appl. No. 13/397,617, May 5, 2015, 6 pages.

"Non-Final Office Action", U.S. Appl. No. 13/397,617, Oct. 9, 2014, 6 pages.

"Non-Final Office Action", U.S. Appl. No. 13/428,879, Feb. 24, 2015, 10 pages.

"Non-Final Office Action", U.S. Appl. No. 13/428,879, Mar. 17, 2014, 10 pages.

"Non-Final Office Action", U.S. Appl. No. 13/428,879, Jun. 26, 2015, 13 pages.

"Non-Final Office Action", U.S. Appl. No. 13/432,311, Jun. 2, 2015, 25 pages.

"Non-Final Office Action", U.S. Appl. No. 13/432,311, Jul. 8, 2014, 33 pages.

"Non-Final Office Action", U.S. Appl. No. 13/432,372, May 9, 2014, 26 pages.

"Non-Final Office Action", U.S. Appl. No. 13/432,372, Oct. 24, 2014, 27 pages.

"Non-Final Office Action", U.S. Appl. No. 13/440,165, Feb. 13, 2015, 10 pages.

"Non-Final Office Action", U.S. Appl. No. 13/440,165, Oct. 16, 2014, 11 pages.

"Non-Final Office Action", U.S. Appl. No. 13/477,646, Jun. 18, 2015, 43 pages.

"Non-Final Office Action", U.S. Appl. No. 13/477,646, Oct. 6, 2014, 34 pages.

"Non-Final Office Action", U.S. Appl. No. 13/477,646, Nov. 22, 2013, 20 pages.

"Non-Final Office Action", U.S. Appl. No. 13/525,649, Jan. 29, 2014, 7 pages.

"Non-Final Office Action", U.S. Appl. No. 13/525,649, Feb. 5, 2015, 7 pages.

"Non-Final Office Action", U.S. Appl. No. 13/525,649, Jun. 5, 2014, 7 pages.

"Non-Final Office Action", U.S. Appl. No. 13/570,073, Jan. 23, 2015, 7 pages.

"Non-Final Office Action", U.S. Appl. No. 13/631,308, Feb. 23, 2015, 9 pages.

"Non-Final Office Action", U.S. Appl. No. 13/722,917, May 21, 2015, 12 pages.

"Non-Final Office Action", U.S. Appl. No. 13/774,875, Nov. 24, 2014, 8 pages.

"Non-Final Office Action", U.S. Appl. No. 14/134,993, Jan. 22, 2015, 17 pages.

"Non-Final Office Action", U.S. Appl. No. 14/134,993, Apr. 17, 2014, 34 pages.

"Notice of Allowance", U.S. Appl. No. 13/336,895, Aug. 11, 2014, 6 pages.

"Notice of Allowance", U.S. Appl. No. 13/343,675, Sep. 16, 2013, 8 pages.

"Notice of Allowance", U.S. Appl. No. 13/355,836, Jun. 13, 2014, 11 pages.

"Notice of Allowance", U.S. Appl. No. 13/355,836, Oct. 8, 2014, 11 pages.

"Notice of Allowance", U.S. Appl. No. 13/356,545, Mar. 28, 2014, 6 pages.

"Notice of Allowance", U.S. Appl. No. 13/488,145, Nov. 19, 2014, 8 pages.

"Restriction Requirement", U.S. Appl. No. 13/355,836, Sep. 27, 2013, 6 pages.

"Restriction Requirement", U.S. Appl. No. 13/397,539, Dec. 1, 2014, 6 pages.

"Restriction Requirement", U.S. Appl. No. 13/488,145, Sep. 8, 2014, 14 pages.

"Restriction Requirement", U.S. Appl. No. 13/570,073, Nov. 18, 2014, 7 pages.

"Supplemental Notice of Allowance", U.S. Appl. No. 13/356,545, Jul. 22, 2014, 2 pages.

"Supplementary European Search Report", EP Application No. 13769961.7, Mar. 3, 2015, 3 pages.

"Two-Faced: Transparent Phone with Dual Touch Screens", Retrieved from <http://gajitz.com/two-faced-transparent-phone-with-dual-touch-screens/>, Jun. 7, 2012, 3 pages.

"Written Opinion", Application No. PCT/US2013/061225, Oct. 10, 2014, 6 Pages.

Allen,"ELiXIR—Solid-State Luminaire with Enhanced Light Extraction by Internal Reflection", Journal of Display Technology, vol. 3, No. 2, Available at <http://www.nanolab.uc.edu/Publications/PDFfiles/355.pdf>, Jun. 2007, pp. 155-159.

Aron,"'Sprinting' chips could push phones to the speed limit", New Scientist, Feb. 20, 2012, Issue #2852, Feb. 20, 2012, 2 pages.

Baluja,"Non-Intrusive Gaze Tracking Using Artificial Neural Networks", Technical Report CMU-CS-94-102, Available at <http://citeseerx.ist.psu.edu/viewdoc/download?doi=10.1.1.33.4027&rep=rep1&type=pdf>, Jan. 5, 1994, 14 pages.

Barger,"COTS Cooling", Publication of the National Electronics Manufacturing Center of Excellence, Retrieved from: <http://www.empf.org/empfasis/2009/Oct09/cots.html> on Jul. 9, 2012, Oct. 2009, 4 pages.

Baudisch,"Back-of-Device Interaction Allows Creating Very Small Touch Devices", In Proceedings of 27th International Conference on Human Factors in Computing Systems, Retrieved from <http://citeseerx.ist.psu.edu/viewdoc/download?doi=10.1.1.160.3337&rep=rep1&type=pdf>, Apr. 2005, 10 pages.

Baxtor,"TwinTech GeForce GTS 250 XT OC 1GB Graphics Card", retrieved from <http://www.tweaktown.com/reviews/2733/twintech_geforce_gts_250_xt_oc_1gb_graphics_card/index3.html> on Dec. 30, 2011, Apr. 24, 2009, 4 pages.

Chang-Yen,"A Monolithic PDMS Waveguide System Fabricated Using Soft-Lithography Techniques", In Journal of Lightwave Technology, vol. 23, No. 6, Jun. 2005, 6 pages.

(56) References Cited

OTHER PUBLICATIONS

Charles,"Design of Optically Path Length Matched, Three-Dimensional Photonic Circuits Comprising Uniquely Routed Waveguides", In Proceedings of Applied Optics, vol. 51, Issue 27, Sep. 20, 2012, 11 pages.
Chen,"A Study of Fiber-to-Fiber Losses in Waveguide Grating Routers", In Journal of Lightwave Technology, vol. 15, No. 10, Oct. 1997, 5 pages.
Chen,"Strategies for 3D Video with Wide Fields-of-View", IEEE Proceeding Optoelectronics, vol. 148, Issue 2, Available at <http://ieeexplore.ieee.org/stamp/stamp.jsp?tp=&arnumber=926823>, Apr. 2001, pp. 85-90.
Cheng,"Waveguide Displays Based on Polymer-dispersed Liquid Crystals", SPIE Newsroom, Available at <http://spie.org/documents/Newsroom/Imported/003805/003805_10.pdf>, Aug. 12, 2011, 2 pages.
Chirgwin,"Researchers propose 'overclock' scheme for mobiles—Processing at a sprint to overcome tech limitations", The Register, Feb. 21, 2012, 2 pages.
Coldewey,"Researchers Propose "Computational Sprinting" To Speed Up Chips by 1000%—But Only for a Second", TechCrunch, Feb. 28, 2012, Feb. 29, 2012, 2 pages.
Cottier,"Label-free Highly Sensitive Detection of (small) Molecules by Wavelength Interrogation of Integrated Optical Chips", n Proceedings of Sensors and Actuators B: Chemical, vol. 91, Issue 1-3, Jun. 1, 2003, pp. 241-251.
DeAgazio,"Selecting Display Backlighting for Portable, Handheld Devices", Hearst Electronics Products, retrieved from <http://www2.electronicproducts.com/Selecting_display_backlighting_for_portable_handheld_devices-article-farcglobal-feb2008-html.aspx> on Jan. 12, 2012, Jan. 2, 2008, 4 pages.
Dumon,"Compact Arrayed Waveguide Grating Devices in Silicon-on-Insulator", In Proceedings of the IEEE/LEOS Symposium Benelux Chapter, May 27, 2014, 4 pages.
Eadicicco,"First Transparent Tablet Lets You Touch from Both Sides", Retrieved from <http://blog.laptopmag.com/first-transparent-tablet>, Dec. 26, 2013, 4 pages.
Glendenning,"Polymer Micro-Optics via Micro Injection Moulding", Available at: https://web.archive.org/web/20120310003606/http://www.microsystems.uk.com/english/polymer_optics_injection_moulding.html, Jan. 10, 2011, 6 pages.
Greenemeier,"Could "Computational Sprinting" Speed Up Smart Phones without Burning Them Out?", Scientific American, Feb. 29, 2012, 2 pages.
Greiner,"Bandpass engineering of lithographically scribed channel-waveguide Bragg gratings", In Proceedings of Optics Letters, vol. 29, No. 8, Apr. 15, 2004, pp. 806-808.
Han,"Accurate diffraction efficiency control for multiplexed volume holographic gratings", Retrieved at: opticalengineering.spiedigitallibrary.org/data/Journals/. . ./2799_1, 2002, 4 pages.
Hua,"Engineering of Head-mounted Projective Displays", In Proceedings of Applied Optics, vol. 39, No. 22, Aug. 1, 2000, 11 pages.
Ismail,"Improved Arrayed-Waveguide-Grating Layout Avoiding Systematic Phase Errors", In Proceedings of Optics Express, vol. 19, No. 9, Apr. 25, 2011, pp. 8781-8794.
Jacques,"Polarized Light Imaging of Tissue", Available at <http://www.lumamed.com/documents/5_polarized%20light%20imaging.pdf>, 2004, 17 pages.
Jarvenpaa,"Compact near-to-eye display with integrated gaze tracker", Second International Conference on Computer Engineering and Applications, Mar. 19, 2010, 9 pages.
Jaworski,"A Novel Design of Heat Sink with PCM for Electronics Cooling", 10th International Conference on Thermal Energy Storage, Stockton, May 31-Jun. 2, 2006, retrieved from <https://intraweb.stockton.edu/eyos/energy_studies/content/docs/FINAL_PRESENTATIONS/4b-6%20.pdf> on Jan. 5, 2012, May 31, 2006, 8 pages.
Karp,"Planar Micro-optic Solar Concentration using Multiple Imaging Lenses into a Common Slab Waveguide", In Proceedings of SPIE vol. 7407, Available at <http://psilab.ucsd.edu/research/slab_concentration/files/SPIE_Slab_Published.pdf>, Jan. 2009, 11 pages.
Kress,"Exit Pupil for Wearable See-through displays", Downloaded From: http://proceedings.spiedigitallibrary.org/ on Jan. 31, 2015 Terms of Use: http://spiedl.org/terms, 2012, 8 pages.
Krishnan,"A Novel Hybrid Heat Sink Using Phase Change Materials for Transient Thermal Management of Electronics", IEEE transactions on components and packaging technologies, vol. 28, No. 2, retrieved from <http://ieeexplore.ieee.org/stamp/stamp.jsp?tp=&arnumber=1432936> on Jan. 5, 2012, Jun. 2005, pp. 281-289.
L,"All-Nanoparticle Concave Diffraction Grating Fabricated by Self-Assembly onto Magnetically-Recorded Templates", In Proceedings of Optical Express, vol. 21, Issue 1, Jan. 2013, 1 page.
Lanman,"Near-eye Light Field Displays", In Journal of ACM Transactions on Graphics, vol. 32, No. 6, Nov. 2013, 10 pages.
Large,"Parallel Optics in Waveguide Displays: a Flat Panel Autostereoscopic", Display Technology, Journal of, Retrieved from <http://download.microsoft.com/download/D/2/E/D2E425F8-CF3C-4C71-A4A2-70F9D4081007/ParallelOpticsinWaveguideDisplaysMS090925.Final.pdf>, Jun. 21, 2010, pp. 1-7.
Lerner,"Penn Helps Rethink Smartphone Design with 'Computational Sprinting'", Penn News Release, Feb. 28, 2012, 2 pages.
Li,"Design Optimization of Reflective Polarizers for LCD Backlight Recycling", Journal of Display Technology, vol. 5, No. 8, Available at <http://ieeexplore.ieee.org/stamp/stamp.jsp?tp=&arnumber=5196840>, Aug. 2009, pp. 335-340.
Li,"Switchable Electro-optic Diffractive Lens with High Efficiency for Ophthalmic Applications", PNAS Apr. 18, 2006 vol. 103 No. 16 6100-6104, Retrieved from: <http://www.pnas.org/content/103/16/6100.long> Feb. 22, 2012, Feb. 2, 2006, 4 pages.
Man,"IT Equipment Noise Emission Standards: Overview of New Development in the Next Edition of ISO/ECMA Standards", In Proceedings of 37th International Congress and Exposition on Noise Control Engineering, Available at <http://www.ecma-international.org/activities/Acoustics/Inter-noise%202008%20paper%20on%20ECMA-74%20updates.pdf >, Oct. 26, 2008, 8 pages.
Massenot,"Multiplexed holographic transmission gratings recorded in holographic polymer-dispersed liquid crystals: static and dynamic studies", Retrieved at: http://oatao.univ-toulouse.fr/2874/, 2005, 8 pages.
McMillan,"Your Future iPhone May Be Stuffed with Wax", Aug. 23, 2013, 3 pages.
Mei,"An all fiber interferometric gradient hydrophone with optical path length compensation", In Proceedings of Summaries of Papers Presented at the Conference on Lasers and Electro-Optics, May 28, 1999, 2 pages.
Melcher,"LCoS for High Performance Displays", In Proceedings of LEOS 2003, Available at <http://ieeexplore.ieee.org/stamp/stamp.jsp?tp=&arnumber=1253048>, Oct. 27, 2003, pp. 812-813.
Minier,"Diffraction Characteristics of Superimposed Holographic gratings in Planar Optical waveguides", IEEE Photonics Technology Letters, vol. 4, No. 10, Oct. 1992, 4 pages.
Moore,"Computational sprinting pushes smartphones till they're tired", Michigan News Release, Feb. 28, 2012, 2 pages.
Morga,"History of SAW Devices", In Proceedings of the IEEE International Frequency Control Symposium, May 27, 1998, 22 pages.
Nguyen,"Advanced Cooling System Using Miniature Heat Pipes in Mobile PC", IEEE Transactions on Components and Packaging Technology, vol. 23, No. 1, Available at <http://ieeexplore.ieee.org/stamp/stamp.jsp?tp=&arnumber=833046&userType=inst>, Mar. 2000, pp. 86-90.
Owano,"Study explores computing bursts for smartphones", PhysOrg.com, Feb. 21, 2012, 2 pages.
Papaefthymiou,"Computational Sprinting on a Hardware/Software Testbed", In the Proceedings of the 18th Eighteenth International Conference on Architectural Support for Programming Languages and Operating Systems (ASPLOS), Mar. 2013., 12 pages.
Patrizio,"Researchers Working on Ways to Put 16-Core Processors in Smartphones", Brighthand, Mar. 18, 2012, 2 pages.

(56) References Cited

OTHER PUBLICATIONS

Pu,"Exposure schedule for multiplexing holograms in photopolymer films", Retrieved at: lo.epfl.ch/webdav/site/lo/shared/1996/OE_35_2824_Oct1996.pdf, Oct. 1996, 6 pages.
Raghavan,"Computational Sprinting", In the Proceedings of the 18th Symposium on High Performance Computer Architecture (HPCA), Feb. 2012, 12 pages.
Raghavan,"Designing for Responsiveness with Computational Sprinting", IEEE Micro's "Top Picks of 2012" Issue, May 2013, 8 pages.
Scott,"RearType: Text Entry Using Keys on the Back of a Device", In Proceedings of 12th Conference on Human-Computer Interaction with Mobile Devices and Services, Retrieved from <https://research.microsoft.com/pubs/135609/reartype%20mobilehci.pdf>, Sep. 7, 2010, 9 pages.
Singh"Laser-Based Head-Tracked 3D Display Research", Journal of Display Technology, vol. 6, No. 10, Available at <http://ieeexplore.ieee.org/stamp/stamp.jsp?tp=&arnumber=5462999>, Oct. 2010, pp. 531-543.
Smalley,"Anisotropic Leaky-Mode Modulator for Holographic Video Displays", In Proceedings of Nature, vol. 498, Jun. 20, 2013, 6 pages.
Stupar,"Optimization of Phase Change Material Heat Sinks for Low Duty Cycle High Peak Load Power Supplies", IEEE transactions on components, packaging and manufacturing technology, retrieved from <http://ieeexplore.ieee.org/stamp/stamp.jsp?tp=&arnumber=6081913> on Jan. 5, 2012, Nov. 15, 2011, 14 pages.
Tari,"CFD Analyses of a Notebook Computer Thermal Management System and a Proposed Passive Cooling Alternative", IEEE Transactions on Components and Packaging Technologies, vol. 33, No. 2, retrieved from <http://ieeexplore.ieee.org/stamp/stamp.jsp?tp=&arnumber=5466211> on Dec. 30, 2011, Jun. 2010, pp. 443-452.
Teng,"Fabrication of nanoscale zero-mode waveguides using microlithography for single molecule sensing", In Proceedings of Nanotechnology, vol. 23, No. 45, Jul. 7, 2012, 7 pages.
Tien,"Microcontact Printing of SAMs", In Proceedings of Thin Films, vol. 24, May 28, 2014, 24 pages.
Travis,"Collimated Light from a Waveguide for a Display Backlight", Optics Express—Retrieved from <http://download.microsoft.com/download/D/2/E/D2E425F8-CF3C-4C71-A4A2-70F9D4081007/OpticsExpressbacklightpaper.pdf>, Oct. 15, 2009, pp. 19714-19719.
Travis,"The Design of Backlights for View-Sequential 3D", Microsoft Corporation, Available at <http://download.microsoft.com/download/D/2/E/D2E425F8-CF3C-4C71-A4A2-70F9D4081007/Backlightforviewsequentialautostereo.docx>, Jul. 3, 2010, 4 pages.
van"A Survey of Augmented Reality Technologies, Applications and Limitations", The International Journal of Virtual Reality, 2010, 9(2), Available at <http://www.ijvr.org/issues/issue2-2010/paper1%20.pdf>, Jun. 2010, pp. 1-19.
Walker,"Thermalright Ultra-120 Extreme CPU Cooler", retrieved from <http://www.pro-clockers.com/cooling/66-thermalright-ultra-120-extreme-cpu-cooler.html> on Dec. 30, 2011, Jul. 2, 2009, 7 pages.
Westerinen,"Light Guide Display and Field of View", U.S. Appl. No. 13/428,879, filed Mar. 23, 2012, 46 pages.
Wigdor,"LucidTouch: A See-Through Mobile Device", In Proceedings of 20th Annual ACM symposium on User Interface Software and Technology, Retrieved from <http://dl.acm.org/citation.cfm?id=1294259>, Oct. 7, 2007, 10 pages.
Yan,"Multiplexing holograms in the photopolymer with equal diffraction efficiency", 2005, 9 pages.
Zharkova,"Study of the Dynamics of Transmission Gratings Growth on Holographic Polymer-Dispersed Liquid Crystals", International Conference on Methods of Aerophysical Research, ICMAR 2008, 2008, 4 pages.
"Variable Groove Depth (VGD) Master Gratings", Retrieved from: <http://www.horiba.com/scientific/products/diffraction-gratings/catalog/variable-groove-depth-vgd/> May 28, 2014, 2 pages.
Grabarnik, et al., "Concave Diffraction Gratings Fabricated with Planar Lithography", In Proceedings of SPIE, vol. 6992, May 3, 2008, 8 pages.
Lindau "Controlling the Groove Depth of Holographic Gratings", In Proceedings of Optical System Design, Analysis, and Production, vol. 0399, Oct. 26, 1983, 2 pages.
Xie, et al., "Fabrication of Varied-Line-Spacing Grating by Elastic Medium", In Proceedings SPIE 5636, Holography, Diffractive Optics, and Applications II, Nov. 2004, 4 pages.
"Restriction Requirement", U.S. Appl No. 14/447,419, Aug. 4, 2015, 6 pages.
Ando, Y. et al., "Development of Three-Dimensional Microstages Using Inclined Deep-Reactive Ion Etching", Journal of Microelectromechanical Systems, vol. 16, Issue 3, IEEE, Jun. 2007, 9 pages.
Gila, B. et al., "First Results From a Multi-Ion Beam Lithography and Processing System At The University Of Florida", Twenty-First International Conference, Application of Accelerators in Research and Industry, AIP Conference Proceedings, vol. 1336, Issue 1, Jun. 2011, 5 pages.
Garcia, G. et al., "COMET: Content Mediator Architecture for Content-aware Networks", Conference Proceedings, Future Network and Mobile Summit, Jun. 2011, 8 pages.
Antonopoulos, P. et al., "Efficient Updates for Web-Scale Indexes over the Cloud", IEEE 28th International conference on Data Engineering Workshops, Apr. 2012, 8 pages.
Levandoski, J., "Ranking and New Database Architectures", in Proceedings of the 7th International Workshop on Ranking in Databases, Aug. 2013, 4 pages.
ISA European Patent Office, International Search Report and Written Opinion Issued in Application No. PCT/US2015/042371, Oct. 2, 2015, WIPO, 10 pages.
ISA European Patent Office, International Search Report and Written Opinion Issued in Application No. PCT/US2015/042259, Oct. 12, 2015, WIPO, 11 pages.
ISA European Patent Office, International Search Report and Written Opinion Issued in Application No. PCT/US2015/041909, Oct. 20, 2015, WIPO, 13 pages.
ISA European Patent Office, International Search Report and Written Opinion Issued in Application No. PCT/US2015/041930, Oct. 20, 2015, WIPO, 12 pages.
ISA European Patent Office, International Search Report and Written Opinion Issued in Application No. PCT/US2015/042187, Oct. 20, 2015, WIPO, 10 pages.
ISA European Patent Office, International Search Report and Written Opinion Issued in Application No. PCT/US2015/041900, Oct. 21, 2015, WIPO, 12 pages.
ISA European Patent Office, International Search Report and Written Opinion Issued in Application No. PCT/US2015/042226, Oct. 27, 2015, WIPO, 10 pages.
ISA European Patent Office, International Search Report and Written Opinion Issued in Application No. PCT/US2015/042205, Oct. 30, 2015, WIPO, 10 pages.
ISA European Patent Office, International Search Report and Written Opinion Issued in Application No. PCT/US2015/042218, Nov. 6, 2015, WIPO, 10 pages.
ISA European Patent Office, International Search Report and Written Opinion Issued in Application No. PCT/US2015/041046, Nov. 9, 2015, WIPO, 15 pages.

* cited by examiner

MICROFABRICATION

BACKGROUND

Microfabrication refers to the fabrication of desired structures of micrometer scales and smaller. Microfabrication may involve etching of and/or deposition on a substrate (and possibly etching of and/or deposition on a film deposited on the substrate) to create the desired microstructure on the substrate (or film on the substrate). As used herein, the term "patterning a substrate" or similar encompasses all such etching of/deposition on a substrate or substrate film.

Wet etching involves using a liquid etchant to selectively dislodge parts of a film deposited on a surface of a substrate and/or parts of the surface of substrate itself. The etchant reacts chemically with the substrate/film to remove parts of the substrate/film that are exposed to the etchant. The selective etching may be achieved by depositing a suitable protective layer on the substrate/film that exposes only parts of the substrate/film to the chemical effects of etchant and protects the remaining parts from the chemical effects of the etchant. The protective layer may be formed of a photoresist or other protective mask layer. The photoresist or other mask may be deposited over the whole of an etching surface area then exposed and developed to create a desired "image", which is then engraved in the substrate/film by the etchant to form a three dimensional structure.

Dry etching involves selectively exposing a substrate/film (e.g. using a similar photoresist mask) to a bombardment of energetic particles to dislodge parts of the substrate/film that are exposed to the particles (sometimes referred to as "sputtering"). An example is ion beam etching in which parts are exposed to a beam of ions. Those exposed parts may be dislodged as a result of the ions chemically reacting with those parts to dislodge them (sometimes referred to as "chemical sputtering") and/or physically dislodging those parts due to their kinetic energy (sometimes referred to as "physical sputtering").

In contrast to etching, deposition—such as ion-beam deposition or immersion-based deposition—involves applying material to rather than removing material from a substrate/film.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted in the Background section.

According to a first aspect, a microfabrication process for fabricating microstructures on a substrate is provided. The substrate has a current diffraction grating pattern formed by current surface modulations over at least a portion of the substrate's surface that exhibit a substantially uniform grating linewidth over the surface portion. The process comprises gradually changing an immersion depth of the substrate in a fluid, the fluid for patterning the substrate, so that different points on the surface portion are immersed in the fluid for different immersion times. The fluid changes the linewidth of the surface modulations at each immersed point on the surface portion by an amount determined by the immersion time of that point, thereby changing the current diffraction grating pattern to a new diffraction grating pattern formed by new surface modulations over the surface portion that exhibit a spatially varying grating linewidth that varies over the surface portion.

According to a second aspect, a microfabrication apparatus for fabricating microstructures on a substrate is provided. The substrate has a current diffraction grating pattern formed by current surface modulations over at least a portion of the substrate's surface that exhibit a substantially uniform grating linewidth over the surface portion. The apparatus comprises a substrate holder for supporting the substrate, a fluid container, a drive mechanism, and a controller. The fluid container configured to hold a fluid which is for patterning the substrate. The drive mechanism is coupled to the substrate holder. The controller is configured to control the drive mechanism to gradually change an immersion depth of the substrate in the fluid so that different points on the surface portion are immersed in the fluid for different immersion times. The fluid changes the linewidth of the surface modulations at each immersed point on the surface portion by an amount determined by the immersion time of that point, thereby changing the current diffraction grating pattern to a new diffraction grating pattern formed by new surface modulations over the surface portion that exhibit a spatially varying grating linewidth that varies over the surface portion.

According to a third aspect, products obtained by any of the manufacturing processes and/or using any of the manufacturing apparatuses disclosed herein are provided.

BRIEF DESCRIPTION OF FIGURES

To aid understanding of the subject matter, reference will now be made by way of example only to the following drawings in which.

Figure 1A:
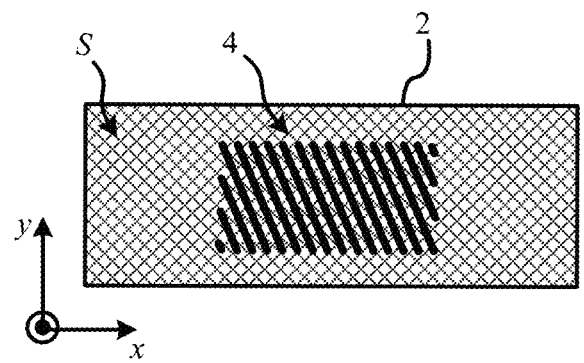
FIG. 1A is a schematic plan view of an optical component.

It should be noted that the drawings are not necessarily to scale unless otherwise indicated. Emphasis is instead placed on explaining the principles of particular embodiments.

DETAILED DESCRIPTION

Microfabrication processes may be used in the manufacturing of optical components. One example is the fabrication of optically diffractive structures (transmissive and/or reflective) that cause diffraction of visible light. Diffraction occurs when a propagating wave interacts with a structure, such as an obstacle or slit. Diffraction can be described as the interference of waves and is most pronounced when that structure is comparable in size to the wavelength of the wave. Optical diffraction of visible light is due to the wave nature of light and can be described as the interference of light waves. Visible light has wavelengths between approximately 390 and 700 nanometers (nm) and diffraction of visible light is most pronounced when propagating light encounters structures similar scale e.g. of order 100 or 1000 nm in scale.

One example of a diffractive structure is a periodic structure. Periodic structures can cause diffraction of light which is typically most pronounced when the periodic structure has a spatial period of similar size to the wavelength of the light. Types of periodic structures include, for instance, surface modulations on a surface of an optical component, refractive index modulations, holograms etc. When propagating light encounters the periodic structure, diffraction causes the light to be split into multiple beams in different directions. These directions depend on the wavelength of the light thus diffractions gratings cause dispersion of polychromatic (e.g. white) light, whereby the polychromatic light is split into different coloured beams travelling in different directions.

When the period structure is on a surface of an optical component, it is referred to a surface grating. When the periodic structure is due to modulation of the surface itself, it is referred to as a surface relief grating (SRG). An example of a SRG is uniform straight grooves in a surface of an optical component that are separated by uniform straight groove spacing regions. Groove spacing regions are referred to herein as "lines", "grating lines" and "filling regions". The nature of the diffraction by a SRG depends both on the wavelength of light incident on the grating and various optical characteristics of the SRG, such as line spacing, groove depth and groove slant angle. An SRG can be fabricated by way of a suitable microfabrication process, which may involve etching of and/or deposition on a substrate to fabricate a desired periodic microstructure on the substrate. The substrate may be the optical component itself or a production master such as a mould for manufacturing optical components.

SRGs have many useful applications. One example is an SRG light guide application. A light guide is an optical component used to transport light by way of internal reflection (e.g. total internal reflection) within the light guide. A light guide may be used, for instance, in a light guide-based display system for transporting light of a desired image from a light engine to a human eye to make the image visible to the eye. Incoupling and outcoupling SRGs on surface(s) of the light guide can be used for inputting light to and outputting light from the waveguide respectively.

Embodiments will now be described in the context of the manufacturing of SRGs.

Figure 1B:
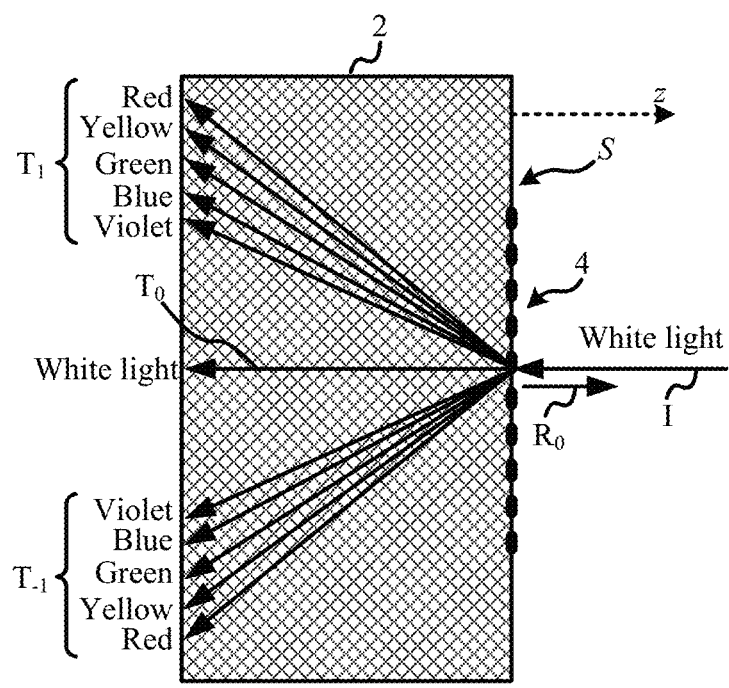
FIG. 1B is a schematic illustration of an optical component, shown interacting with incident light and viewed from the side.

FIGS. 1A and 1B show from the top and the side respectively a substantially transparent optical component 2, such as a wave guide, having an outer surface S. At least a portion of the surface S exhibits surface modulations that constitute a SRG pattern 4, which is one example of a microstructure. Such a portion is referred to as a "grating area". The surface S lies substantially in a plane defined by x and y axes as shown in FIG. 1A. The z-axis represents a direction perpendicular to that plane and thus a direction substantially perpendicular to the surface S (referred to as the "the normal" to the surface S).

FIG. 1B shows the optical component 2, and in particular the grating 4, interacting with an incoming illuminating light beam I that is inwardly incident on the SRG 4. The light I is white light in this example, and thus has multiple colour components. The light I interacts with the grating 4 which splits the light into several beams directed inwardly into the optical component 2. Some of the light I may also be reflected back from the surface S as a reflected beam R0. A zero-order mode inward beam T0 and any reflection R0 are created in accordance with the normal principles of diffraction as well as other non-zero-order (±n-order) modes (which can be explained as wave interference). FIG. 1B shows first-order inward beams T1, T-1; it will be appreciated that higher-order beams may or may not also be created depending on the configuration of the optical component 2. Because the nature of the diffraction is dependent on wavelength, for higher-order modes, different colour components (i.e. wavelength components) of the incident light I are, when present, split into beams of different colours at different angles of propagation relative to one another as illustrated in FIG. 1B.

Figure 2A:
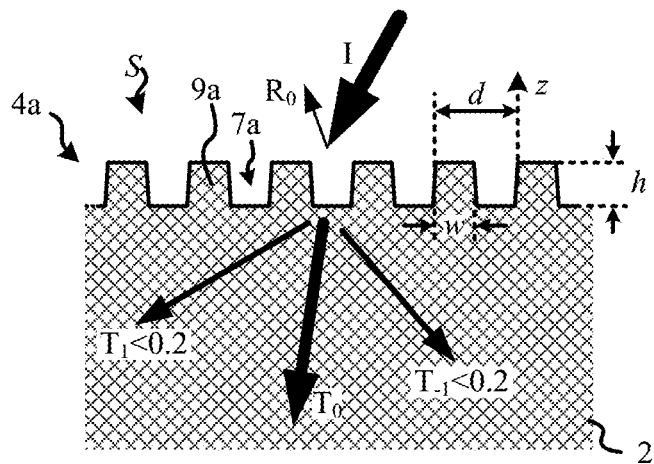
FIG. 2A is a schematic illustration of a straight binary grating, shown interacting with incident light and viewed from the side.
Figure 2B:
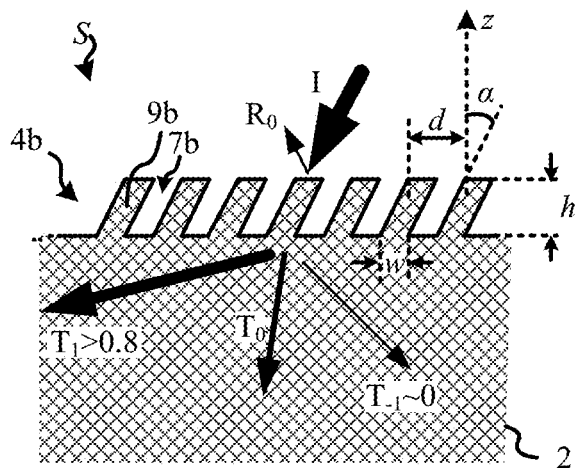
FIG. 2B is a schematic illustration of a slanted binary grating, shown interacting with incident light and viewed from the side.
Figure 2C:
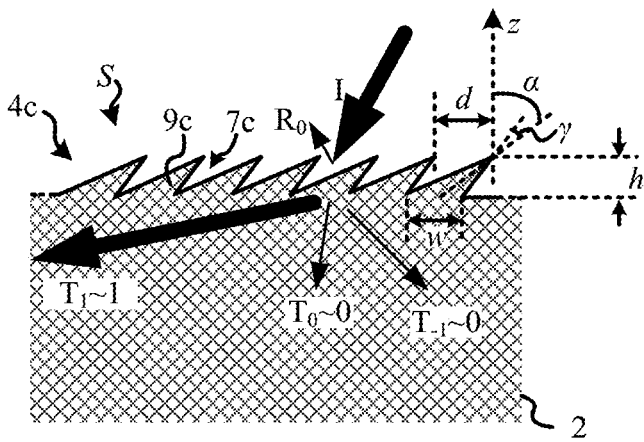
FIG. 2C is a schematic illustration of an overhanging triangular grating, shown interacting with incident light and viewed from the side.

FIGS. 2A-2C are close-up schematic cross sectional views of different exemplary SRG patterns 4a-4c (collectively referenced as 4 herein) that may formed by modulation of the surface S of the optical component 2 (which is viewed from the side in these figures). Light beams are denoted as arrows whose thicknesses denote approximate relative intensity (with higher intensity beams shown as thicker arrows).

FIG. 2A shows an example of a "straight binary grating" pattern 4a. The straight binary grating 4a is formed of a series of grooves 7a in the surface S separated by protruding groove spacing regions 9a which are also referred to herein as "filling regions", "grating lines" or simply "lines". The pattern 4a has a spatial period of d (referred to as the "grating period"), which is the distance over which the modulations' shape repeats. The grooves 7a have a depth h and have substantially straight walls and substantially flat bases. As such, the filling regions have a height h and a width that is substantially uniform over the height h of the filling regions, labelled "w" in FIG. 2A (with w being some fraction f of the period: w=f*d).

For a straight binary grating, the walls are substantially perpendicular to the surface S. For this reason, the grating 4a causes symmetric diffraction of incident light I that is entering perpendicularly to the surface, in that each +n-order mode beam (e.g. T1) created by the pattern 4a has substantially the same intensity as the corresponding −n-order mode beam (e.g. T-1), typically less than about one fifth (0.2) of the intensity of the incident beam I.

FIG. 2B shows an example of a "slanted binary grating" pattern 4b. The slanted pattern 4b is also formed of grooves, labelled 7b, in the surface S having substantially straight walls and substantially flat bases separated by lines 9b of width w. However, in contrast to the straight pattern 4a, the walls are slanted by an amount relative to the normal, denoted by the angle $\alpha$ in FIG. 2B. The grooves 7b have a depth h as measured along the normal. Due to the asymmetry introduced by the non-zero slant, ±n-order mode inward beams travelling away from the slant direction have greater intensity that their ∓n-order mode counterparts (e.g. in the example of FIG. 2B, the T1 beam is directed away from the direction of slant and has usually greater intensity than the T-1 beam, though this depends on e.g. the grating period d); by increasing the slant by a sufficient amount, those ∓n counterparts can be substantially eliminated (i.e. to have substantially zero intensity). The intensity of the T0 beam is typically also reduced very much by a slanted binary grating such that, in the example of FIG. 2B, the first-order beam T1 typically has an intensity of at most about four fifths (0.8) the intensity of the incident beam I.

The binary patterns 4a and 4b can be viewed as spatial waveforms embedded in the surface S that have a substantially square wave shape (with period d). In the case of the pattern 4b, the shape is a skewed square wave shape skewed by a.

FIG. 2C shows an example of an "overhanging triangular grating" pattern 4c which is a special case of an overhanging "trapezoidal grating" pattern. The triangular pattern 4c is formed of grooves 7c in the surface S that are triangular in shape (and which thus have discernible tips) and which have a depth h as measured along the normal. Filling regions 9c take the form of triangular, tooth-like protrusions (teeth), having medians that make an angle α with the normal (a being the slant angle of the pattern 4c). The teeth have tips that are separated by d (which is the grating period of the pattern 4c), a width that is w at the base of the teeth and which narrows to substantially zero at the tips of the teeth. For the pattern of FIG. 4c, w≈d, but generally can be w<d. The pattern is overhanging in that the tips of the teeth extend over the tips of the grooves. It is possible to construct overhanging triangular grating patterns that substantially eliminate both the transmission-mode T0 beam and the ∓n-mode beams, leaving only ±n-order mode beams (e.g. only T1). The grooves have walls which are at an angle γ to the median (wall angle).

The pattern 4c can be viewed as a spatial waveform embedded in S that has a substantially triangular wave shape, which is skewed by α.

The grooves and spacing regions that form the patterns 4a-4c constitute surface modulations over the surface S.

In general, surface modulations over a surface result in surface protrusions and exhibit what is referred to herein as a "modulation width", which is a characteristic scale along the surface of those surface modulations and which can be generally be defined in relation to a characteristic width of those protrusions that arise from the modulation over that surface. Generally, modulations over a surface can arise at least from extraneous material deposited on that surface, from modulations of that surface itself, or a combination of both. "Modulation width" is equivalently referred to as "grating linewidth" herein when the modulations form a diffraction grating pattern (with the grating linewidth being the width of the grating lines).

In the case of patterns 4a-4c, the grooves 7a-7c (collectively referenced as 7) and spacing regions 9a-9c (collectively referenced as 9) that form the patterns 4a-4c constitute modulations of the surface S itself, which exhibit a modulation width that can be defined as a characteristic width of the protruding filling regions 9. In the case of patterns 4a and 4b, protruding filling regions have a width that is substantially uniform over their height h and equal to w, and the modulation width can be defined as w. In the case of the pattern 4c, protruding filling regions have a width w at the base of the protrusions, and the modulation width can be usefully defined, for instance, as the base width w (although it can also be defined in terms of a filling region width at some other elevation). Other gratings are also possible, for example other types of trapezoidal grating patterns (which may not narrow in width all the way to zero), sinusoidal grating patterns etc. and have a modulation width that can be readily defined in a suitable manner.

In light guide-based display applications (e.g. where SRGs are used for coupling of light into and out of a light guide of the display system), d is typically between about 250 and 500 nm, and h between about 30 and 400 nm. The slant angle α is typically between about 0 and 45 degrees (such that slant direction is typically elevated above the surface S by an amount between about 45 and 90 degrees).

An SRG has a diffraction efficiency defined in terms of the intensity of desired diffracted beam(s) (e.g. T1) relative to the intensity of the illuminating beam I, and can be expressed as a ratio η of those intensities. As will be apparent from the above, slanted binary gratings (e.g. 4b—up to η≈0.8 if T1 is the desired beam) can achieve higher efficiency than non-slanted grating (e.g. 4a—only up to about η≈0.2 if T1 is the desired beam). With overhanging triangular gratings, it is possible to achieve near-optimal efficiencies of η 1.

The performance of a SRG light guide-based display is strongly dependent on the efficiency of the gratings and their dependence on the incidence angle of the incoming light.

The techniques described below enable gratings (including, for example, binary, trapezoidal (e.g. triangular) and sinusoidal gratings) to be manufactured with variable w. That is, with modulation widths which vary as a function $w(x,y)$ of position on the surface S.

In the following examples, a substrate (5—FIG. 3) has an outer surface S' that patterned on by way of microfabrication. The final patterned substrate may itself be for use as optical components (e.g. wave guides) in an optical system (e.g. display system) or it may for use as a production master for manufacturing such components e.g. moulds for moulding such components from polymer. Where the substrate 5 is an optical component, the substrate's surface S' is the same as the surface S shown FIGS. 2A-2C. When the substrate 5 is a master (e.g. a mould) S' still corresponds to S in that the structure of S' is transferred (that is, copied) to S as part the manufacturing (e.g. moulding) process. The surface S' lies substantially in a plane referred to herein as the xy-plane having x and y coordinates equivalent to those shown in FIG. 1A in relation to the surface S, with points in the xy-plane (and thus on the surface S') being denoted (x,y).

The substrate is patterned over at least a portion of its surface (grating area) to form a grating, which may then be transferred to other components where applicable. The dimensional size of the grating area (e.g. being of order mm, cm or higher) is significantly larger than the grating period—there typical being e.g. thousands of lines/grooves per mm of grating. As such, even though there are a discrete number of lines/grooves in the grating area, this number is sufficiently large that grating characteristics can be viewed as mathematical functions over a substantially continuous domain of geometric points r=(x,y) (bold typeface denoting xy-vectors). For this reason, the general notation $c(x,y)$ (or similar) is adopted for grating characteristics hereinbelow. Where applicable, references to "points" on surface portion (or similar) are to be construed accordingly, including in the claims below.

The linewitdh $w(x,y)$, grating depth $h(x,y)$ and slant $a(x,y)$ are examples of such grating characteristics. The techniques below enable grating patterns to be manufactured on a surface portion with linewidth $w(x,y)$, depth $h(x,y)$ and slant $a(x,y)$ that vary over that surface portion and, moreover, which do so gradually i.e. as substantially continuous mathematical functions over said substantially continuous domain of points.

A grating characteristic $c(r)=c(x,y)$ is considered to spatially vary over a surface portion in the present context provided that grating characteristic $c(r)$ changes by an overall amount $\Delta C=\max c(r)-\min c(r)$ that is significant as compared with a characteristic scale C of the grating characteristic $c(r)$ itself, such as $C=\max |c(r)|$. Examples of significant changes include when $\Delta C$ is the same order of magnitude, or one order of magnitude lower than, C. For example, for the grating patterns mentioned above with reference to FIGS. 2A-2C, the linewidth would be considered to be spatially varying in the present context at least when the linewidth changes by an overall amount $\Delta W$ of order of 5% of the period d or more. Where a grating characteristic exhibits only small, unintended variations, such as small, unintended variations arising from undesired manufacturing inaccuracies or imprecisions and/or other variations restricted to a similar scale, that characteristic is not considered to be spatially varying in the context of the present disclosure.

Spatial variations are considered gradual (substantially continuous) providing that grating characteristic's spatial gradient $\nabla c(x,y)$—where $\nabla=(\partial_x, \partial_y)$ is the gradient function for the xy-plane, is sufficiently small at all points $r=(x,y)$ on the surface portion so that changes in the grating characteristic $c(r)$ over small distances of order d are always at least 3 orders of magnitude smaller than $\Delta C$ at all points r i.e. so that $|\nabla c(r)|*d \sim 10^{-3}*\Delta C$ or less for all r on the surface portion.

Figure 3:
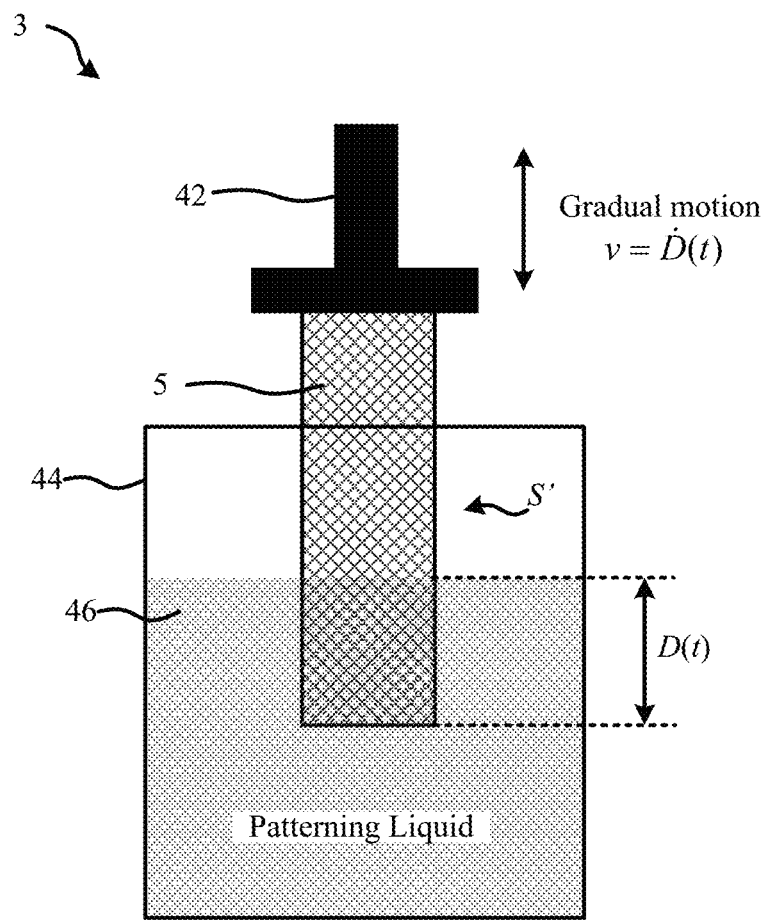
FIG. 3 schematically illustrates a microfabrication system.

For instance, the disclosed techniques enable gratings to be manufactured with gradually varying linewidth $w(x,y)$ which does not change by more than the order of $10^{-2}$ nm over a single grating period d, itself of order $10^2$ or $10^3$ nm, so that the linewidth gradient $\nabla w(x,y)$ does not exceed an amount of order of $10^{-4}$ or $10^{-5}$—at any point on the surface portion. FIG. 3 is a schematic illustration showing components of a microfabrication system 3. The microfabrication system 3 can be used in microfabrication process for fabricating microstructures on a substrate 5. The system 3 comprises a substrate holder 42 and a liquid container 44 that contains a fluid (liquid) 46. The substrate holder supports the substrate 5. The fluid 46 is for patterning the substrate 5, and in the following examples is a liquid etchant for selectively removing material from at least a portion of the surface S' which can be substrate material of the substrate itself or some other material that is deposited on the surface S' which is not shown in FIG. 3 but which is shown in later figures where applicable. Other material of this nature is referred to herein as "extraneous deposits" on S'.

The substrate 5 is supported by the holder 42, and the holder 42 and the container 44 are arranged, in a manner that enables the substrate 5 when supported to be lowered into and/or raised out of the fluid 44 at a vertical velocity v, thereby immersing the substrate 5 in and/or removing the substrate 5 from the fluid 44 in an immersion step of a microfabrication process. In either case, an immersion depth D(t) of the substrate 5 in the fluid 46 is changed over time t as $\dot{D}(t)=v$ where $\dot{D}(t)$ is the rate of chance of D(t). The immersion depth D(t) is shown in FIG. 3 as a distance between the far end of the substrate 5 from the holder 42 and the surface of the fluid 46, but can be defined as any distance measure that conveys a current extent to which the substrate 5 is currently immersed in the patterning liquid 42. The liquid 5 patterns the substrate when immersed in the liquid by reacting with the substrate or with extraneous deposits on the substrate to either remove material from or deposit material on the surface S', depending on the nature of the fluid 46. Removed material may be substrate material of the substrate itself or extraneous material deposited on the substrate.

Prior to the immersion step, the substrate 5 has initial (current) surface modulations over at least a portion of the substrate's surface S'. These surface modulations exhibit a substantially uniform modulation width over the surface portion i.e. which is substantially the same at all points (x,y) on that surface portion. This modulation width is a characteristic width (e.g. base width) of surface protrusions resulting from these current modulations, which can be formed by protruding extraneous material deposited on S' and/or by protruding substrate material of the substrate itself. These surface modulations constitute a current diffraction grating pattern that exhibits a substantially uniform linewidth of grating lines over the surface portion (i.e. which is substantially the same at all xy-locations on the surface portion).

The total amount of time for which a point (x,y) on the surface S' remains immersed in the liquid 46 is referred to at the immersion time of that point. Whilst that point is immersed, the patterning fluid acts to remove material from or deposit material on any surface protuberances at that point and thus changes the modulation width at that point. The amount of material that is removed/deposited at that point depends on the immersion time of that point. Changing the immersion depth D(t) of the substrate in the patterning fluid 46 results in different points on the surface S' being immersed in the fluid 46 for different amounts of time so that the modulation width is changed by different amounts at different points on S'. In other words, the initial surface modulations are changed to new surface modulations exhibiting a spatially varying modulation width w(x,y) that varies over S' i.e. that varies as a function of xy-position. This causes the current diffraction pattern to be correspondingly changed to a new diffraction grating pattern that exhibits a spatially varying linewidths of grating lines over S' i.e. that also varies over the surface S' as a function of xy-position.

The immersion/removal of the substrate is gradual in that the immersion depth D(t) of the substrate 5 in the fluid 46 is gradually changed over time (i.e. $\dot{D}(t)=v$ is slow). Herein a "gradual change in an immersion depth" or similar refers to the immersing of a substrate in and/or the raising of a substrate out of a patterning liquid (e.g. etchant) sufficiently slowly for the effects of the liquid (e.g. etching effect) on the modulation width at points on the substrate's surface which remain immersed in the liquid for more time to be measurably greater than the effects of the liquid on the modulation width at points on that surface which remain immersed in the liquid for less time. Whether or not particular motion is considered gradual in context will depend on factors such as a characteristic patterning (e.g. etching) speed of the liquid.

In the configuration of FIG. 3, the motion v of substrate is substantially linear i.e. the substrate holder 42 is moved upwards or downwards in substantially the direction of gravity.

Exemplary microfabrication processes which use the microfabrication system 3 in various configurations will now be described with reference to FIGS. 4A-6D. Substrates having a fused silica composition are used in these examples, however this is just an exemplary substrate material and the techniques may be applied to substrates made of different materials. It should be noted that these figures are not to scale and in particular that the distance scales of the various surface modulations are greatly enlarged to aid illustration. In practice, the changes in the linewidths are gradual such that the difference in linewidths between neighboring lines is hardly visible (though the effects can be observed from the manner in which light is diffracted). For example, an exemplary pattern may have a period of 500 nm and have a change of linewidth of 50 nm in 1 mm distance along the surface. There are 2000 lines in one mm and thus the difference in linewidths between neighboring lines in this case is only 0.025 nm.

Figure 4A:
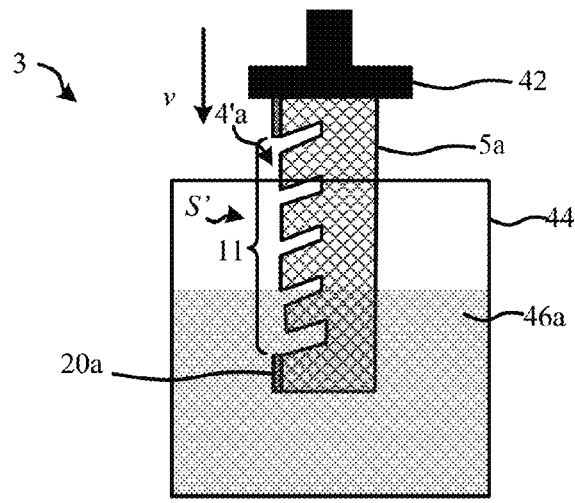
FIG. 4A is a schematic illustration of a microfabrication system during an immersions step of a first microfabrication process.

FIG. 4A is a schematic illustration of the system 3 during an immersion step of a first microfabrication process, which is a first dip etching process in which a first substrate 5a is itself etched. That is, a first process in which a first type of patterning liquid is used, which is a first etchant 46a that reacts with the substrate 5a itself to remove substrate material of the substrate 5a itself. In this example, the etchant 4a reacts with the fused silica from which the substrate 5a is composed, although this is only an example and the same type of process may be applied to substrates made from different materials.

The substrate 5a has surface modulations over a portion 11 of the substrate's surface S', which are surface modulations of the surface portion 11 itself formed by grooves and spacing regions in the surface portion 11. These surface modulations constitute a first grating pattern 4'a, which is shown as a binary grating pattern but which could be a different grating pattern (e.g. triangular).

The substrate 5a is supported by the holder 42 and is gradually lowered into the etchant 46a during the dip etching. A protective mask 20a is selectively deposited on the substrate's surface S' to expose only the surface portion 11, and which protects the remaining portion of the surface S' (which are not intended for dip etching) from the effects of the etchant 46a so that only the surface portion 11a is etched. The other surfaces of the substrate 5a may also be similarly protected (not shown in FIG. 4A).

Figure 4B:
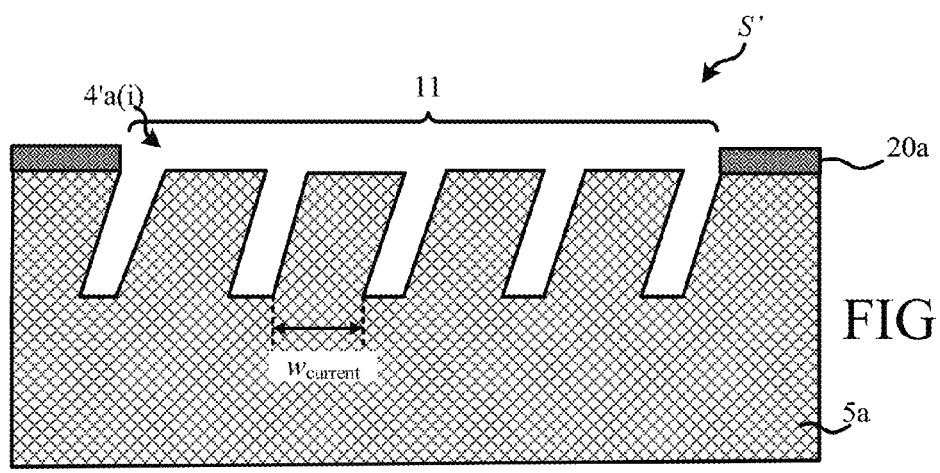
FIGS. 4B and 4C schematically illustrate a cross section of a substrate before and after the immersion step of FIG. 4A respectively.

FIG. 4B shows a cross section of the substrate 5a before the immersion step of FIG. 4A. At this point, the grooves and filling regions constitute initial surface modulations of the surface portion S', which are substantially uniform in that the lines in the surface portion 11 have substantially the same width as one another $w_{current}$, which is the linewidth before the immersion of the substrate 5a. The uniform filling regions constitute an initial grating pattern 4'a(i). The initial surface modulations can be formed, for instance, using known etching techniques e.g. ion beam etching of the substrate 5a.

Figure 4C:
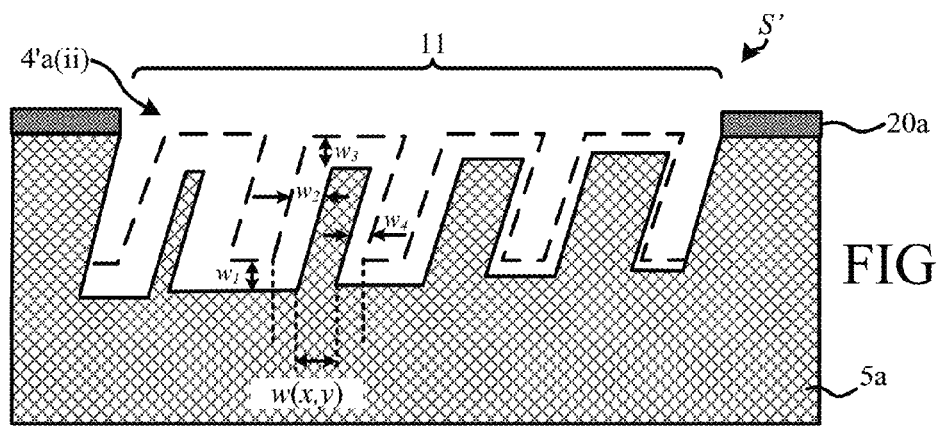

FIG. 4C shows a cross section of the substrate 5a after the immersion step of FIG. 4A has been completed. In FIG. 4C, the left hand side of the substrate 5a corresponds to the far end of the substrate 5a from the holder 42 as shown in FIG. 4A i.e. the left end of the substrate is the end that was first immersed in the etchant 46a and which was thus subject to the longest immersion time.

The etchant 46a attacks all fused silica surfaces exposed to the etchant. The etching by the etchant 46a is substantially isotropic (i.e. the etching speed is the same in all directions), which affects the filling regions as shown in FIG. 4C (note the dotted lines in FIG. 4C serve to illustrate the original extent of the filling regions before etching). For each filling region, a width of substrate material w2, w4 is removed from the left hand and right hand side of that filling region respectively; an amount of substrate material denoted by w3 is removed from the top of that region and an amount of material w1 is removed from the groove left-adjacent to that region. The amounts w1-w4 depend on the total time for which that region is immersed in the etchant 46a, which varies as a function of xy-position. Thus, it will be appreciated that w1-w4 vary as a function of xy-position although not explicitly denoted as such. For any given filling region at a point (x,y), an approximation $w1 \approx w2 \approx w3 \approx w4 \approx \Delta w(x,y)$ can be made, wherein $\Delta w(x,y)$ is determined by the speed of the etching and the immersion time at that point (x,y). Thus the width of that filling region is reduced to about $w_{current} - 2*\Delta w(x,y)$. Thus, it can be seen that an effect of the immersion step is to change the initial surface modulations to new surface modulations that exhibit a spatially varying modulation width $w(x,y) \approx w_{current} - 2*\Delta w(x,y)$ that varies over the surface portion 11 i.e. as a function of xy-position. Because the width of each filling region is changed by a slightly different amount, this changes the initial grating pattern 4'a(i) to a new grating pattern 4'a(ii) that exhibits a spatially varying grating linewidth w(x,y) that varies over the surface portion 11 i.e. as a function of xy-position, as illustrated in FIG. 4C.

Figure 5A:
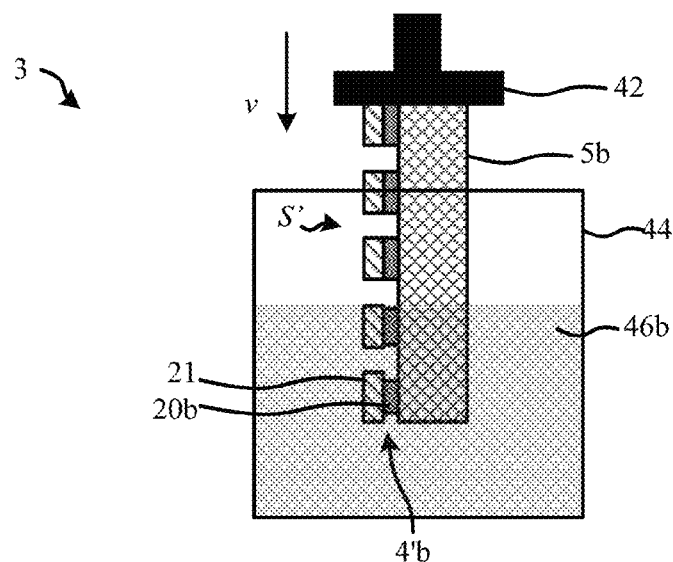
FIG. 5A is a schematic illustration of a microfabrication system during an immersion step of a second microfabrication process.

FIG. 5A is a schematic illustration of the system 3 during an immersion step of a second microfabrication process, which is a second dip etching process in which extraneous material 20b deposited on a second substrate 5b is etched (rather than the substrate 5b itself). That is, a second process in which a second type of patterning liquid is used, which is a second etchant 46b that reacts with this extraneous material to remove some of that material. In this example, the extraneous material is chromium (Cr), although this is only an example and the same type of process may be applied to substrates with different extraneous deposits, such as different metals.

The substrate 5b has surface modulations which are formed by intermittent chromium deposits in the form of chromium lines 20b deposited on the substrate's surface S'. The chromium lines 20b are themselves covered by photoresist 21. The chromium lines form a partial film that leaves regions of the substrate's surface S' exposed but other regions covered. These surface modulations constitute a second grating pattern 4'b.

The substrate 5b is supported by the holder 42 and is gradually lowered into the etchant 46b during the dip etching.

Figure 5B:
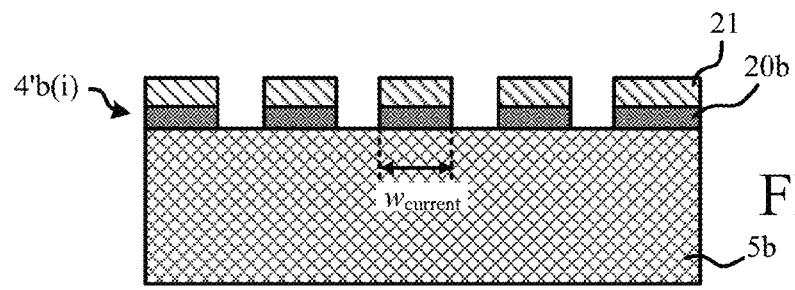
FIGS. 5B and 5C schematically illustrate a cross section of a substrate before and after the immersion step of FIG. 5A respectively.

FIG. 5B shows a cross section of the substrate 5b before the immersion step of FIG. 5A. At this point, the chromium deposits 20b constitute initial, substantially uniform surface modulations over the surface S' in that the individual chromium lines have substantially the same width $w_{current}$ as one another—which is the modulation width before the immersion of the substrate 5b.

The initial surface modulations can be formed using known etching techniques. For example, one manner of achieving this involves first coating the whole (or most) of the surface S' in a mask layer, which would be a chromium layer in this example. The mask layer is then covered with a photoresist. A two-dimensional image of a desired grating pattern is then projected onto the photoresist using conventional techniques. The photoresist is then developed to remove either the exposed parts or the non-exposed parts (depending on the composition of the photoresist), leaving selective parts of the mask layer visible (i.e. revealing only selective parts) and the remaining parts covered by the remaining photoresist. The uncovered parts of the mask layer can then be removed using conventional etching techniques e.g. a Reactive Ion Etching (RIE) process which removes the uncovered parts of the mask but not the parts covered by the photoresist, and which does not substantially affect the substrate itself.

The chromium lines constitute an initial diffraction grating pattern 4'b(i) exhibiting a substantially uniform grating linewidth $w_{current}$ over the surface S' i.e. which is substantially the same at all points (x,y) on the surface S'.

The etchant 46b attacks all non-protected chromium surfaces (not protected by the photoresist 21). The photoresist 21 protects the top parts of the chromium lines and the fused silica (i.e. the substrate 5b itself) protects the bottom part of the chromium lines. Thus, only the sides of the chromium lines are exposed to the etchant 4b during the immersion step of FIG. 5A.

Figure 5C:
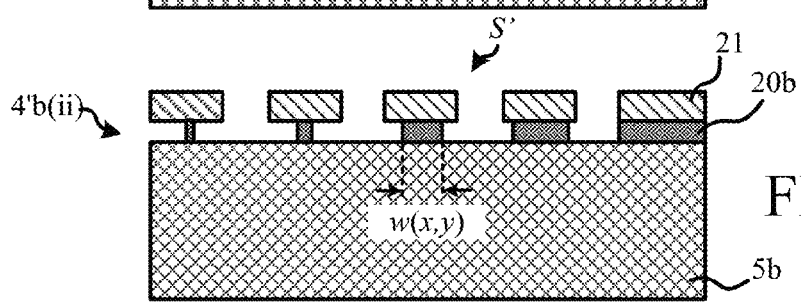

FIG. 5C shows a cross section of the substrate 5b after the immersion step of FIG. 5A has been completed. In FIG. 5C, the left hand side of the substrate 5b corresponds to the far end of the substrate 5b from the holder 42 as shown in FIG. 5A i.e. the left end of the substrate is the end that was first immersed in the etchant 46b and which was thus subject to the longest immersion time.

A respective amount of chromium is removed from the sides of each chromium line. That amount depends on the total time for which that line is immersed in the etchant 46b, which varies as a function of xy-position. Thus, it will be appreciated that said amount varies as a function of xy-position. Thus, it can be seen that an effect of the immersion step is to change the initial surface modulations to new surface modulations that exhibit a spatially varying modulation width w(x,y) that varies over the surface S' i.e. as a function of xy-position. Because the width of each chromium line is changed by a slightly different amount, this changes the initial grating pattern $4'b(i)$ to a new grating pattern $4'b(ii)$ that exhibits a spatially varying grating linewidth w(x,y) that varies over the surface S' i.e. as a function of xy-position, as illustrated in FIG. 5C.

Figure 5D:
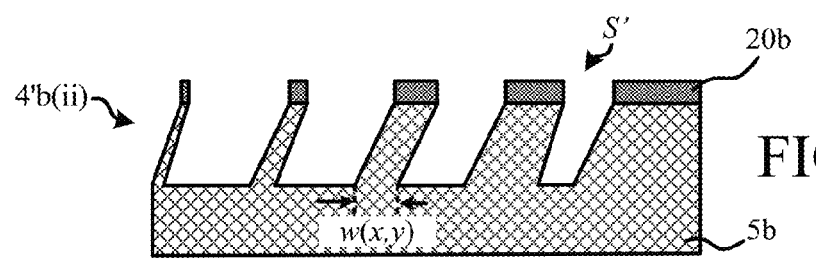
FIG. 5D schematically illustrates a cross section of the substrate of FIG. 5C after further etching.

After completions of the immersion step of FIG. 5A, the substrate can then be subjected to a further etching process in which the remaining chromium serves as an etching mask. This could for example be ion beam etching of the substrate 5b, in which the remaining chromium protects the covered regions of the substrate (and only those regions) from the effects of an ion beam, or further dip etching but of the substrate 5b itself, in which the chromium protects the covered regions (and only those regions) from the effect of a liquid etchant that reacts with the substrate itself (which could have the same composition as the etchant 4a of FIG. 4A). In this manner, the diffraction pattern $4'b(ii)$ can be transferred to the substrate 5b as illustrated in FIG. 5D, which is a cross section of the substrate 5b following such a further etching process.

Figure 6A:
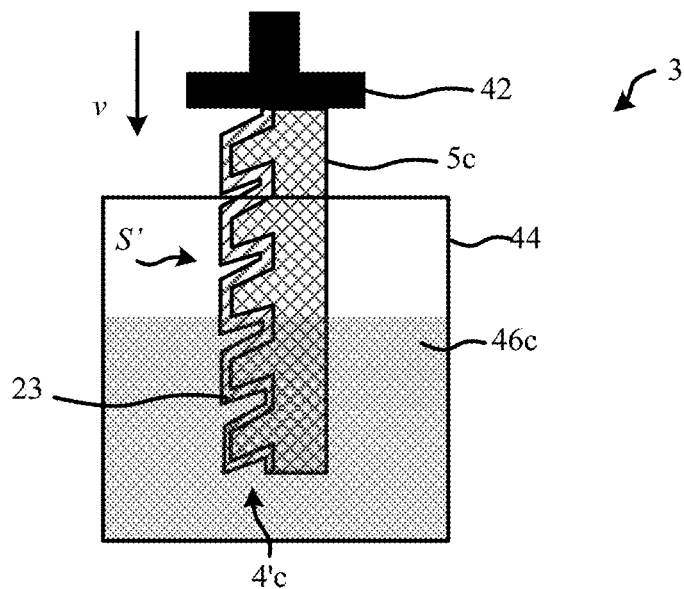
FIG. 6A is a schematic illustration of a microfabrication system during an immersion step of a third microfabrication process.

FIG. 6A is a schematic illustration of the system 3 during an immersion step of a third microfabrication process, which is a third dip etching process in which other extraneous material deposited on a third substrate 5c is etched (rather than the substrate 5c itself). That is, a third process in which a third type of patterning liquid is used, which is a third etchant 46c that reacts with this extraneous material to remove some of that material. In this example, the extraneous material is silicon dioxide ($SiO_2$), which reacts with the etchant 4c although this is only an example and the same type of process may be applied to substrates with different extraneous deposits.

The substrate 5c has surface modulations which are formed by a combination of modulations of the substrate's surface S' itself and a layer 23 of silicon dioxide deposited on the modulated surface S'. These surface modulations constitute a third diffraction pattern $4'c$.

The substrate 5c is supported by the holder 42 and is gradually lowered into the etchant 46c during the dip etching.

Figure 6B:
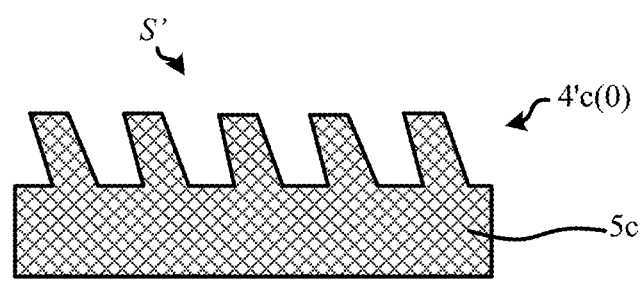
FIGS. 6B and 6C schematically illustrate a cross section of a substrate at different stages before the immersion step of FIG. 6A, and FIG. 6D schematically illustrates a cross section of that substrate after that immersion step.
Figure 6C:
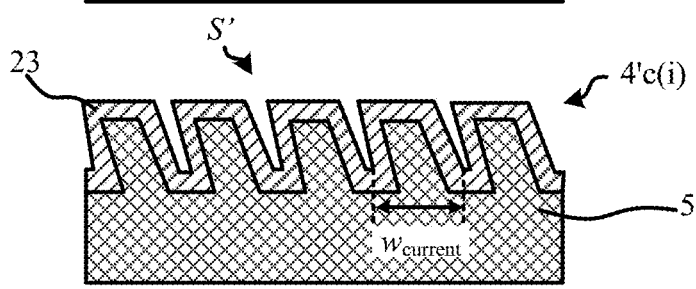

FIGS. 6B and 6C shows cross sections of the substrate 5c at different stages before the immersion step of FIG. 6A.

FIG. 6B shows the substrate 5c before the silicon dioxide layer 23 has been applied. A preliminary grating pattern $4'c(0)$ is formed by only the modulations of the surface S' itself, specifically by substantially uniform grooves and filling regions which can be created e.g. using known etching techniques.

FIG. 6C shows the substrate 5c after the silicone dioxide layer 23 has been applied to the modulated surface S'. The silicon dioxide layer is a substantially even layer that is applied using atomic layer deposition (ALD). This effectively increases a fill factor of the modulations in the surface S' by enlarging the filling regions. This effectively creates surface modulations, formed by the combination of the modulations in the surface S' and the deposited silicon dioxide, that have a modulation width $w_{current}$ that is wider than that of the modulations in the surface S' alone, as illustrated in FIG. 6C. The combined modulations are substantially uniform modulations in that the width $w_{current}$ is substantially constant over the surface S' and constitute an initial (i.e. pre-etching) diffraction grating pattern $4'c(i)$.

Figure 6D:
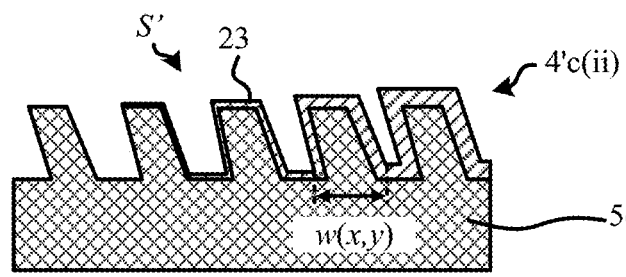
Figure 7:
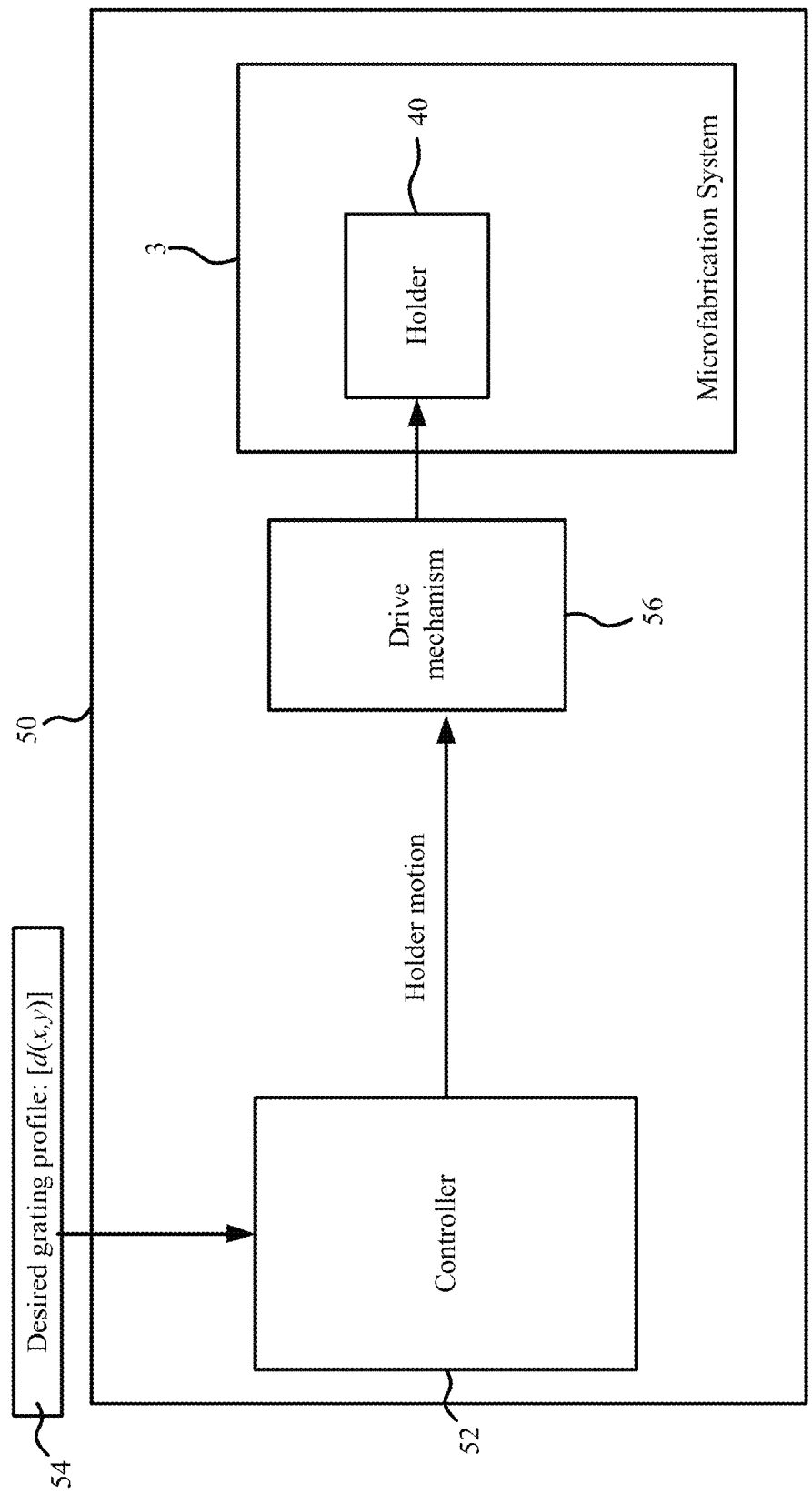
FIG. 7 is a schematic block diagram of a microfabrication apparatus.

The etchant 46c attacks the silicon dioxide 23 deposits but not the fused silica of the substrate 5c itself. FIG. 6D shows a cross section of the substrate 5c after the immersion step of FIG. 6A has been completed. In FIG. 6C, the left hand side of the substrate 5c corresponds to the far end of the substrate 5c from the holder 42 as shown in FIG. 6A i.e. the left end of the substrate is the end that was first immersed in the etchant 46c and which was thus subject to the longest immersion time.

A respective amount of silicon dioxide 23 is removed at each immersed point (x,y). That amount depends on the total time for which that point is immersed in the etchant 46c, which varies as a function of xy-position. Thus, it will be appreciated that the width of each enlarged filling region is reduced by an amount that depends on the xy-position of that filling region, which amounts to a reduction of the fill factor at that point. Thus, it can be seen that an effect of the immersion step is to change the initial surface modulations to new surface modulations that exhibit a spatially varying modulation width w(x,y) (or equivalently a spatially varying, modulated fill factor) that varies over the surface S' i.e. as a function of xy-position. Because the width of each enlarged filling region is changed by a slightly different amount, this changes the initial grating pattern $4'c(i)$ to a new grating pattern $4'c(ii)$ that exhibits a spatially varying grating linewidth w(x,y) that varies over the surface S' i.e. as a function of xy-position, as illustrated in FIG. 6C.

The gradual changing of the immersion depth of the substrate results in a linewidth profile that changes correspondingly gradually (i.e. substantially continuously over a significantly larger distance scale than the grating period d—see above). The scale over which the linewidth w(x,y) changes is sufficiently large compared to the grating period d (that is, the spatial variations in linewidth w(x,y) are sufficiently gradual over the substrate's surface) that the linewidth w(x,y) can be effectively considered as a substantially continuous mathematical function of xy-position that is defined at every point (x,y) in the relevant portion of the xy-place.

As will be apparent, the above described processes result in the creation of new grating patterns that have grating linewidths w(x,y) that vary as a function of xy-position and which thus have gradients $\nabla w(x,y)$ (where $\nabla=(\partial_x,\partial_y)$ is the gradient function for the xy-plane) that are non-zero at at least some xy-locations.

In the above, substantially linear substrate motion is considered that charges an immersion depth D(t). As will be appreciated, this results in grating linewidth profiles w(x,y) that have gradients $\nabla w(x,y)$ substantially aligned with the direction of the linear motion relative to the surface S'. In alternative microfabrication apparatus configurations more complex grating profiles can be created by introducing rotational motion of the substrate 5 in addition to the linear motion that have grating linewidth gradients $\nabla w(x,y)$ whose direction can vary at different points in the xy-plane.

It should be noted that the immersion methods described above do not change the grating period d of patterns to which they are applied. For some grating patterns, the period is substantially constant everywhere on the surface (in which case it remains constant following the immersion); in other cases, the period is not constant to begin with (and is again unchanged by the immersion).

In the above examples of FIGS. 4A-6D, a substrate is gradually immersed in a patterning liquid though it will be appreciated that similar effects can be achieved by alternatively or additionally gradually raising a substrate out of a patterning liquid in which it has already been immersed.

Moreover, whilst in the above a patterning liquid in the form of an etchant is used to remove material to change a modulation width of a grating pattern, alternatively a patterning liquid in the form of a depositant may be used instead, which depositant changes the modulation width by depositing material on the surface portion, in particular by depositing material on surface protrusions resulting from modulations over that surface to increase the width of those protrusions.

FIG. 5 is block diagram of a microfabrication apparatus 50 incorporating the microfabrication system 3. The system comprises a controller 52 having an input configured to receive desired grating profile information 54 that defines a desired grating profile i.e. that defines the manner in which the grating linewidth w(x,y) is to (continuously) vary as a function of position (x,y) on the surface. The controller is connected to a drive mechanism 56. The drive mechanism 56 is mechanically coupled to the holder 42 in a manner that enables it to effect controlled movement of the substrate holder to control the immersion level of the supported substrate 5, in particular vertical, linear movement and possibly rotational movement where applicable. As such, the drive mechanism 38 can be controlled to effect the desired gradual immersion of the substrate in and/or removal of the substrate form the patterning liquid 46, detailed above.

The controller 52 converts the desired grating profile information 54 into control signals that are outputted to the drive mechanism during microfabrication procedures, causing the drive mechanism 36 to move the holder to effect the desired profile in the manner described above. The drive mechanism 56 comprises one or more motors that are mechanically coupled to the holder to effect the desired motion.

The controller 52 can be implemented as code executed on a suitable computer system, and the desired profile information 54 can be held in computer storage as data that is accessible to that code when executed.

Whilst the above considers a substantially software-implemented controller 32, the functionality of the controller can be implemented using software, firmware, hardware (e.g., fixed logic circuitry), or a combination of these implementations. The terms "module," "functionality," "component" and "logic" as used herein generally represent, where applicable, software, firmware, hardware, or a combination thereof. In the case of a software implementation, the module, functionality, or logic represents program code that performs specified tasks when executed on a processor (e.g. CPU or CPUs). The program code can be stored in one or more computer readable memory devices. The features of the techniques described below are platform-independent, meaning that the techniques may be implemented on a variety of commercial computing platforms having a variety of processors.

For example, the apparatus may also include an entity (e.g. software) that causes hardware of a computer of the apparatus to perform operations, e.g., processors functional blocks, and so on. For example, the computer may include a computer-readable medium that may be configured to maintain instructions that cause the computer, and more particularly the operating system and associated hardware of the computer to perform operations. Thus, the instructions function to configure the operating system and associated hardware to perform the operations and in this way result in transformation of the operating system and associated hardware to perform functions. The instructions may be provided by the computer-readable medium to the computer through a variety of different configurations.

One such configuration of a computer-readable medium is signal bearing medium and thus is configured to transmit the instructions (e.g. as a carrier wave) to the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may us magnetic, optical, and other techniques to store instructions and other data.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A microfabrication process for fabricating microstructures on a substrate, the substrate having a current diffraction grating pattern formed by current surface modulations over at least a portion of the substrate's surface that exhibit a substantially uniform grating linewidth over the surface portion, the process comprising:
   gradually changing an immersion depth of the substrate in a fluid, the fluid for patterning the substrate, so that different points on the surface portion are immersed in the fluid for different immersion times;
   wherein the fluid changes the linewidth of the surface modulations at each immersed point on the surface portion by an amount determined by the immersion time of that point, thereby changing the current diffraction grating pattern to a new diffraction grating pattern formed by new surface modulations over the surface portion that exhibit a spatially varying grating linewidth that varies over the surface portion.

2. A microfabrication process according to claim 1 wherein the current surface modulations are formed by modulations of the surface portion itself.

3. A microfabrication process according to claim 2 wherein the current modulations of the surface portion constitute a binary, trapezoidal or sinusoidal grating pattern.

4. A microfabrication process according to claim 1 wherein the current surface modulations are formed by extraneous deposits on the surface portion.

5. A microfabrication process according to claim 4 wherein the extraneous deposits form a partial film on the surface portion that leaves regions of the surface portion exposed.

6. A microfabrication process according to claim 1 wherein the current surface modulations are formed by a combination of modulations of the surface portion itself and extraneous deposits on the modulated surface portion.

7. A microfabrication process according to claim 6 wherein the extraneous deposits cover the entirety of the modulated surface portion.

8. A microfabrication process according to claim 7 wherein the extraneous deposits are applied using atomic layer deposition.

9. A microfabrication process according to claim 1 wherein the fluid is an etchant that changes the modulation width by removing material from the surface portion.

10. A microfabrication process according to claim 9 wherein the removed material is substrate material of the substrate itself.

11. A microfabrication process according to claim 9 wherein the removed material is of extraneous deposits on the surface portion, and wherein the new diffraction pattern results from the extraneous deposits remaining on the substrate after the step of changing the immersion depth has been completed.

12. A microfabrication process according to claim 11 wherein the remaining deposits leave regions of the surface portion exposed and the process further comprises performing further etching of the substrate after the step of changing the immersion depth has been completed, wherein the remaining extraneous deposits on the surface portion serve as an etching mask in the further etching of the substrate so that the new diffraction pattern is transferred to the substrate.

13. A microfabrication process according to claim 12 wherein the further etching comprises dip etching and/or ion beam etching of the substrate.

14. A microfabrication process according to claim 1 wherein the fluid is a depositant that changes the modulation width by depositing material on the surface portion.

15. A microfabrication process according to claim 1 wherein the substrate with the new diffraction pattern is for use as an optical component in an optical system.

16. A microfabrication process according to claim 8 wherein the substrate with the new diffraction pattern is for use as a waveguide in a display system.

17. A microfabrication process according to claim 1 wherein the substrate with the new diffraction pattern is for use as a production master for manufacturing optical components and wherein the process further comprises using the production master to manufacture optical components.

18. A microfabrication apparatus for fabricating microstructures on a substrate, the substrate having current a diffraction grating pattern formed by current surface modulations over at least a portion of the substrate's surface that exhibit a substantially uniform grating linewidth over the surface portion, the apparatus comprising:
    a substrate holder configured to support the substrate;
    a fluid container configured to hold a fluid, the fluid for patterning the substrate;
    a drive mechanism coupled to the substrate holder; and
    a controller configured to control the drive mechanism to gradually change an immersion depth of the substrate in the fluid so that different points on the surface portion are immersed in the fluid for different immersion times;
    wherein the fluid changes the linewidth width of the surface modulations at each immersed point on the surface portion by an amount determined by the immersion time of that point, thereby changing the current diffraction grating pattern to a new diffraction grating pattern formed by new surface modulations that exhibit a spatially varying grating linewidth that varies over the surface portion.

19. A microfabrication process for fabricating microstructures on a substrate, the substrate having a current diffraction grating pattern formed by current surface modulations over at least a portion of the substrate's surface that exhibit a substantially uniform grating linewidth over the surface portion, the process comprising:
    gradually changing an immersion depth of the substrate in an etchant so that different points on the surface portion are immersed in the etchant for different immersion times;
    wherein the etchant changes, by removing material from the surface portion, the linewidth of the surface modulations at each immersed point on the surface portion by an amount determined by the immersion time of that point, thereby changing the current diffraction grating pattern to a new diffraction grating pattern formed by new surface modulations over the surface portion that exhibit a spatially varying grating linewidth that varies over the surface portion.

20. The microfabrication apparatus according to claim 18 wherein the current surface modulations are formed by modulations of the surface portion itself.

* * * * *